(12) United States Patent
Yamaguchi et al.

(10) Patent No.: US 10,818,531 B2
(45) Date of Patent: Oct. 27, 2020

(54) SUBSTRATE TRANSPORT SYSTEM, SUBSTRATE PROCESSING APPARATUS, HAND POSITION ADJUSTMENT METHOD

(71) Applicant: EBARA CORPORATION, Tokyo (JP)

(72) Inventors: Kuniaki Yamaguchi, Tokyo (JP); Haiyang Xu, Tokyo (JP); Koji Maeda, Tokyo (JP); Mitsuhiko Inaba, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 190 days.

(21) Appl. No.: 16/204,979

(22) Filed: Nov. 29, 2018

(65) Prior Publication Data

US 2019/0164796 A1 May 30, 2019

(30) Foreign Application Priority Data

Nov. 30, 2017 (JP) ................. 2017-229916

(51) Int. Cl.
*H01L 21/677* (2006.01)
*H01L 21/68* (2006.01)
*H01L 21/687* (2006.01)
*B65G 47/90* (2006.01)
*H01L 21/67* (2006.01)
*B25J 9/16* (2006.01)

(52) U.S. Cl.
CPC ........ *H01L 21/67745* (2013.01); *B25J 9/163* (2013.01); *B65G 47/905* (2013.01); *H01L 21/6719* (2013.01); *H01L 21/67046* (2013.01); *H01L 21/67173* (2013.01); *H01L 21/67742* (2013.01); *H01L 21/68* (2013.01); *H01L 21/68707* (2013.01); *H01L 21/67748* (2013.01); *H01L 21/67778* (2013.01)

(58) Field of Classification Search
CPC combination set(s) only.
See application file for complete search history.

(56) References Cited

U.S. PATENT DOCUMENTS

| | | | |
|---|---|---|---|
| 6,459,947 B1 * | 10/2002 | Hirata | H01L 21/67259 700/114 |
| 2005/0102064 A1 * | 5/2005 | Donoso | H01L 21/68707 700/254 |
| 2007/0147979 A1 * | 6/2007 | Rice | H01L 21/67748 414/744.1 |
| 2008/0166210 A1 * | 7/2008 | Hudgens | H01L 21/67196 414/288 |
| 2016/0129586 A1 * | 5/2016 | Moura | H01L 21/67265 700/228 |

FOREIGN PATENT DOCUMENTS

| | | |
|---|---|---|
| JP | H10-156774 A | 6/1998 |
| JP | 4601130 B2 | 12/2010 |

* cited by examiner

*Primary Examiner* — Kyle O Logan
(74) *Attorney, Agent, or Firm* — BakerHostetler

(57) ABSTRACT

A substrate transport system includes a hand, a main positioning member permanently mounted on a base, where the main positioning member is engageable with the hand at a position offset by a first distance in the first axis direction and offset by a second distance in the second axis direction from a substrate transfer position, and a control unit that stores a position coordinate in the first axis direction and a position coordinate in the second axis direction of the hand in a state where the hand is positioned by being engaged with the main positioning member.

22 Claims, 19 Drawing Sheets

SUBSTRATE TRANSPORT SYSTEM, SUBSTRATE PROCESSING APPARATUS, HAND POSITION ADJUSTMENT METHOD

CROSS-REFERENCE TO RELATED APPLICATIONS

This application claims the benefit of Japanese Priority Patent Application JP 2017-229916 filed on Nov. 30, 2017, the entire contents of which are incorporated herein by reference.

FIELD

The present technology relates to a substrate transport system, a substrate processing apparatus, and a hand position adjustment method.

BACKGROUND AND SUMMARY

In recent years, with the progress of higher integration of semiconductor devices, the wiring of circuits has become finer and the inter-wiring distance is becoming narrower. In the manufacture of semiconductor devices, many kinds of materials are formed in film form on a silicon wafer to form a laminated structure. In order to form this laminated structure, a technique for making the surface of the wafer flat is important. As a means for planarizing the surface of such a wafer, a polishing apparatus (also referred to as chemical mechanical polishing apparatus) which performs chemical mechanical polishing (CMP) is widely used.

The chemical mechanical polishing (CMP) apparatus generally includes a polishing table having a polishing pad attached thereto, a top ring that holds the wafer, and a nozzle for supplying the polishing liquid onto the polishing pad. While the polishing liquid is supplied onto the polishing pad from the nozzle, the wafer is pressed against the polishing pad by the top ring, and the top ring and the polishing table are relatively moved, thereby to polish the wafer to make the surface flat.

In addition to such a CMP apparatus, the substrate processing apparatus is a device having a function of cleaning a wafer after polishing, and further drying the wafer. It is required to shorten the start up time and the maintenance time in such a substrate processing apparatus. However, in the conventional substrate processing apparatus, when a wafer is held and transported by a pair of openable and closable arms, a human visually observes the operation of teaching the position of the wafer (teaching operation) to this mechanical mechanism, and it takes much time to start up and perform maintenance. There is also a problem that the accuracy also varies depending on the experience and skill of the operator performing the teaching operation.

JP 10-156774 A offers a method of performing teaching in which a substrate as a teaching device having a cylindrical protrusion on the surface is removably installed in a wafer cassette port, and a U-shaped recessed part provided at the tip of the end effecter is engaged with the raised part on the substrate. However, with this method, if the substrate as the teaching device remains disposed on the wafer cassette port, it physically interferes with the end effector at the time of actual wafer transfer, so that the substrate as the teaching device is required to be removed from the wafer cassette port after the teaching operation, whereby it takes time.

In addition, JP 4601130 A offers a method of performing teaching in which a positioning jig is detachably disposed in a reaction chamber, and a substrate mounting plate attached to the tip of the arm is brought into contact with the positioning jig. However, even with this method, since the positioning jig physically interferes with the substrate placing plate at the time of actual wafer transfer in a case where the positioning jig is disposed in the reaction chamber, it is necessary to remove the positioning jig from the inside of the reaction chamber after the teaching operation, whereby it takes time.

It is desirable to provide a substrate transport system capable of teaching a substrate transfer position in a short time and with no variations in accuracy.

A substrate transport system according to an embodiment includes a hand linearly movable along at least a first axis direction and a second axis direction orthogonal to each other, a main positioning member permanently mounted on a base, where the main positioning member is engageable with the hand at a position offset by a first design value in the first axis direction and offset by a second design value in the second axis direction from a substrate transfer position, and a control unit that stores a position coordinate in the first axis direction and a position coordinate in the second axis direction of the hand in a state where the hand is positioned by being engaged with the main positioning member.

A substrate transport system according to an embodiment includes a hand linearly movable along at least a first axis direction and a second axis direction orthogonal to each other, a first main positioning member permanently provided on a base, where the first main positioning member is capable of coming into contact with the hand at a position offset from a substrate transfer position by a first distance in the first axis direction, a second main positioning member permanently installed on the base, where the second main positioning member is capable of coming into contact with the hand at a position offset from the substrate transfer position by a second distance in the second axis direction, and a control unit that stores a position coordinate of the hand in the first axis direction in a state where the hand is positioned by being brought into contact with the first main positioning member, and stores a position coordinate of the hand in the second axis direction in a state where the hand is positioned by being brought into contact with the second main positioning member.

A substrate processing apparatus according to an embodiment includes a substrate transport system having any one of the features described above.

A hand position adjustment method according to an embodiment is a method for adjusting a position of a hand linearly movable along at least a first axis direction and a second axis direction orthogonal to each other. The method includes positioning by engaging the hand with a main positioning member permanently mounted on a base at a position offset by a first design value in the first axis direction and offset by a second design value in the second axis direction from a substrate transfer position, and storing a position coordinate in the first axis direction and a position coordinate in the second axis direction of the hand in a state where the hand is positioned by being engaged with the main positioning member.

A hand position adjustment method according to an embodiment is a method for adjusting a position of a hand linearly movable along at least a first axis direction and a second axis direction orthogonal to each other. The method includes positioning by bringing the hand into contact with a first main positioning member permanently mounted on a base at a position offset from a substrate transfer position by a first design value in the first axis direction, storing a position coordinate of the hand in the first axis direction in a state where the hand is brought into contact with the first main positioning member, positioning by bringing the hand into contact with a second main positioning member permanently mounted on the base at a position offset from the substrate transfer position by a second design value in the second axis direction, and storing a position coordinate of the hand in the second axis direction in a state where the hand is brought into contact with the second main positioning member.

DETAILED DESCRIPTION OF NON-LIMITING EXAMPLE EMBODIMENTS

Figure 1:
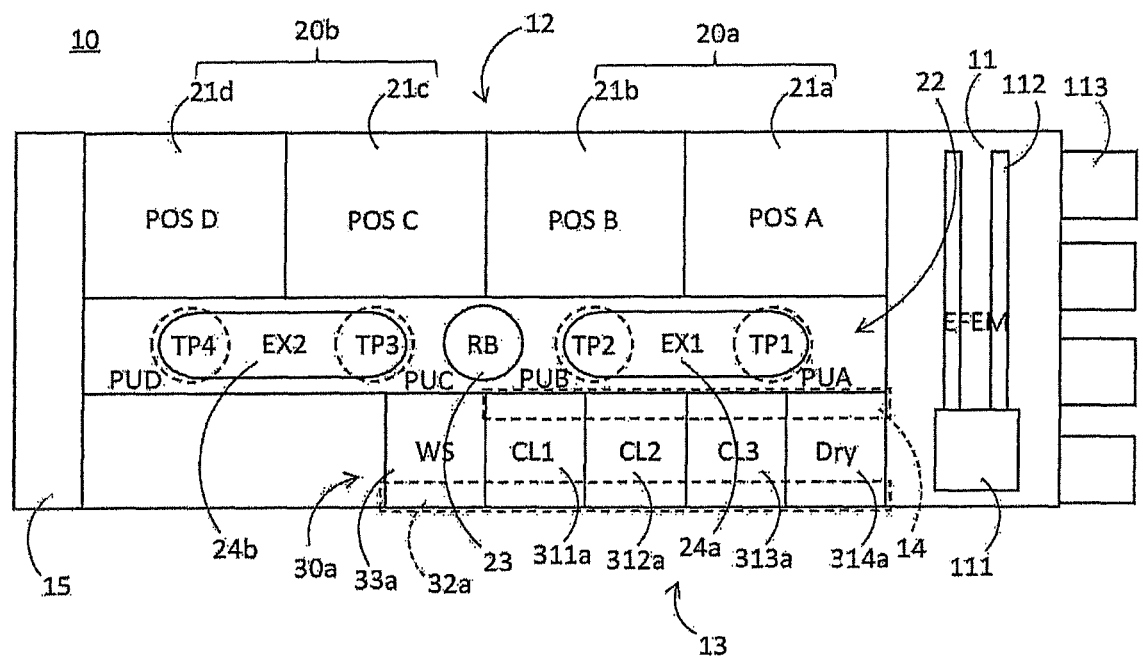
FIG. 1 is a plan view of an overall configuration of a substrate processing apparatus in an embodiment.

Hereinafter, embodiments will be described. In the following description and the drawings used in the following description, the same reference numerals are used for parts which can be constituted in the same manner, and redundant explanations are omitted.

A substrate transport system according to an embodiment includes a hand linearly movable along at least a first axis direction and a second axis direction orthogonal to each other, a main positioning member permanently mounted on a base, where the main positioning member is engageable with the hand at a position offset by a first design value in the first axis direction and offset by a second design value in the second axis direction from a substrate transfer position, and a control unit that stores a position coordinate in the first axis direction and a position coordinate in the second axis direction of the hand in a state where the hand is positioned by being engaged with the main positioning member.

According to the above substrate transport system, the main positioning member is permanently mounted on the base, and the control unit stores the position coordinate in the first axis direction and the position coordinate in the second axis direction of the hand at a position away from the substrate transfer position by a predetermined distance (first design value and second design value) in a state where the hand is positioned by being engaged with the main positioning member. Since the hand is positioned by engaging it with the main positioning member, there is no variation in accuracy, compared with a case where a human performs an teaching operation visually. Further, since the position which is positioned by engaging the hand with the main positioning member is different from the substrate transfer position, it is possible to move the hand to the substrate transfer position without causing the hand to interfere with the main positioning member even if the main positioning member is not detached from the base at the time of actual substrate transfer. Therefore, the working time can be remarkably shortened, compared with a case of the conventional teaching method which requires the operation of detaching the positioning member.

In the substrate transport system, the hand may be linearly movable along a third axis direction orthogonal to the first axis direction and the second axis direction. The substrate transport system may further include a sub positioning member permanently mounted on the base, where the sub positioning member is capable of coming into contact with the hand at a position offset from the substrate transfer position by a third design value in the third axis direction. The control unit may store position coordinate of the hand in the third axis direction in a state where the hand is positioned by being brought into contact with the sub positioning member.

According to this aspect, the control unit stores the position coordinate of the hand in the third axis direction at a position away from the substrate transfer position by a predetermined distance (third design value) in a state where the hand is positioned by being brought into contact with the sub positioning member. This makes it possible to perform the teaching operation in three axes directions in a short time and with no variations in accuracy.

A substrate transport system according to an embodiment includes a hand linearly movable along at least a first axis direction and a second axis direction orthogonal to each other, a first main positioning member permanently provided on a base, where the first main positioning member is capable of coming into contact with the hand at a position offset from a substrate transfer position by a first distance in the first axis direction, a second main positioning member permanently installed on the base, where the second main positioning member is capable of coming into contact with the hand at a position offset from the substrate transfer position by a second distance in the second axis direction, and a control unit that stores a position coordinate of the hand in the first axis direction in a state where the hand is positioned by being brought into contact with the first main positioning member, and stores a position coordinate of the hand in the second axis direction in a state where the hand is positioned by being brought into contact with the second main positioning member.

In the substrate transport system, the hand may be linearly movable along a third axis direction orthogonal to the first axis direction and the second axis direction. The substrate transport system may further include a sub positioning member permanently mounted on the base, where the sub positioning member is capable of coming into contact with the hand at a position offset from the substrate transfer position by a third distance in the third axis direction. The control unit may store a position coordinate of the hand in the third axis direction in a state where the hand is positioned by being brought into contact with the sub positioning member.

In the substrate transport system, the hand may have a pair of openable and closable arms.

In the substrate transport system, the main positioning member and the sub positioning member may be integral.

In the substrate transport system, the main positioning member and the sub positioning member may be separate members.

In the substrate transport system, one of the hand and the main positioning member may have a boss and the other may have a hole engageable with the boss.

In the substrate transport system, the boss may have a distal end which is tapered.

According to this aspect, it is possible to easily insert the boss provided on one of the hand and the main positioning member into the hole provided in the other.

In the substrate transport system, the main positioning member may be disposed outside of a transport route.

In the substrate transport system, the sub positioning member may also be disposed outside of the transport route.

The substrate transport system may further include a cover that is provided on the base and that surrounds the substrate transfer position. The cover may have an opening for loading and unloading a substrate. The sub positioning member may be positioned so as to be brought into contact with the hand before the hand comes into contact with an edge of the opening when the hand is moved in the third axis direction.

According to this aspect, since the hand is stopped by being brought into contact with the sub positioning member before the hand comes into contact with the edge of the opening when the hand is moved in the second axis direction so that it is possible to prevent the hand from being damaged due to contact of the hand with the edge of the opening.

In the substrate transport system, the control unit may compare the stored position coordinate in the first axis direction and the stored position coordinate in the second axis direction with a position coordinate in the first axis direction and a position coordinate in the second axis direction in a normal state, respectively, and issue a warning in a case where any one of the differences is greater than a predetermined threshold.

According to this aspect, it is possible to self-diagnose whether the position control of the hand is normal. It is possible to request urgent response from the operator by issuing a warning if an abnormality has occurred.

In the substrate transport system, the control unit may compare the stored position coordinate in the first axis direction and the stored position coordinate in the second axis direction with a plurality of past data of position coordinates in the first axis direction and a plurality of past data of position coordinates in the second axis direction, respectively, and issue a warning in a case where it is determined that a deviation in a certain direction occurs.

A plus/minus measurement error from the center value occurs if the deviation is a simple measurement error, whereas the deviation in a certain direction often occurs in the case of screw loosening or aged deterioration. Therefore, according to this aspect, it is possible to find screw loosening and aged deterioration at an early stage by keeping the data as a record, and determining the presence or absence of a trend, comparing the recorded data with not only the latest data but also previous data.

The substrate transport system further may include a first electric actuator that linearly moves the hand along the first axis direction, a second electric actuator that linearly moves the hand along the second axis direction, and a torque sensor that detects a direction and a magnitude of a force applied to the hand when the hand is manually moved in the first axis direction or the second axis direction. The control unit may control the first electric actuator or the second electric actuator so as to assist the force applied to the hand based on an detection result by the torque sensor.

According to this aspect, since the control unit controls the actuator so as to assist the force applied to the hand, an operator having even a weak force can easily move the hand and perform a teaching operation.

In the substrate transport system, the hand may include a force sensor that detects a direction and a magnitude of a force applied to the hand. The control unit may determine, based on a detection result by the force sensor, whether the hand is brought into contact with the sub positioning member to store the position coordinate of the hand in the third axis direction when it is determined that the hand is brought into contact with the sub positioning member.

According to this aspect, automatic teaching can be performed in the third axis direction.

In the substrate transport system, the hand may include a force sensor that detects a direction and a magnitude of a force applied to the hand. The control unit may determine, based on the detection result by the force sensor, whether the hand is brought into contact with a first main positioning member, and whether the hand is brought into contact with a second main positioning member, and stores the position coordinate of the hand in the first axis direction when it is determined that the hand is brought into contact with the first main positioning member, and stores the position coordinate of the hand in the second axis direction when it is determined that the hand is brought into contact with the second main positioning member.

According to this aspect, automatic teaching can be performed in the first axis direction and the second axis direction.

A substrate processing apparatus according to an embodiment includes a substrate transport system having any one of the features described above.

A hand position adjustment method according to an embodiment is a method for adjusting a position of a hand linearly movable along at least a first axis direction and a second axis direction orthogonal to each other. The method includes positioning by engaging the hand with a main positioning member permanently mounted on a base at a position offset by a first design value in the first axis direction and offset by a second design value in the second axis direction from a substrate transfer position, and storing a position coordinate in the first axis direction and a position coordinate in the second axis direction of the hand in a state where the hand is positioned by being engaged with the main positioning member.

In the above hand position adjustment method, the hand may be linearly movable along a third axis direction orthogonal to the first axis direction and the second axis direction. The method may further include bringing the hand into contact with a sub positioning member permanently mounted on the base at a position offset from the substrate transfer position by a third design value in the third axis direction, and storing a position coordinate of the hand in the third axis direction in a state where the hand is brought into contact with the sub positioning member.

A hand position adjustment method according to an embodiment is a method for adjusting a position of a hand linearly movable along at least a first axis direction and a second axis direction orthogonal to each other. The method includes positioning by bringing the hand into contact with a first main positioning member permanently mounted on a base at a position offset from a substrate transfer position by a first design value in the first axis direction, storing a position coordinate of the hand in the first axis direction in a state where the hand is brought into contact with the first main positioning member, positioning by bringing the hand into contact with a second main positioning member permanently mounted on the base at a position offset from the substrate transfer position by a second design value in the second axis direction, and storing a position coordinate of the hand in the second axis direction in a state where the hand is brought into contact with the second main positioning member.

In the above hand position adjustment method, the hand may be linearly movable along a third axis direction orthogonal to the first axis direction and the second axis direction. The method may further include positioning by bringing the hand into contact with a sub positioning member permanently mounted on the base at a position offset from the substrate transfer position by a third design value in the third axis direction, and storing a position coordinate of the hand in the third axis direction in a state where the hand is brought into contact with the sub positioning member.

<Substrate Processing Apparatus>

Figure 2:
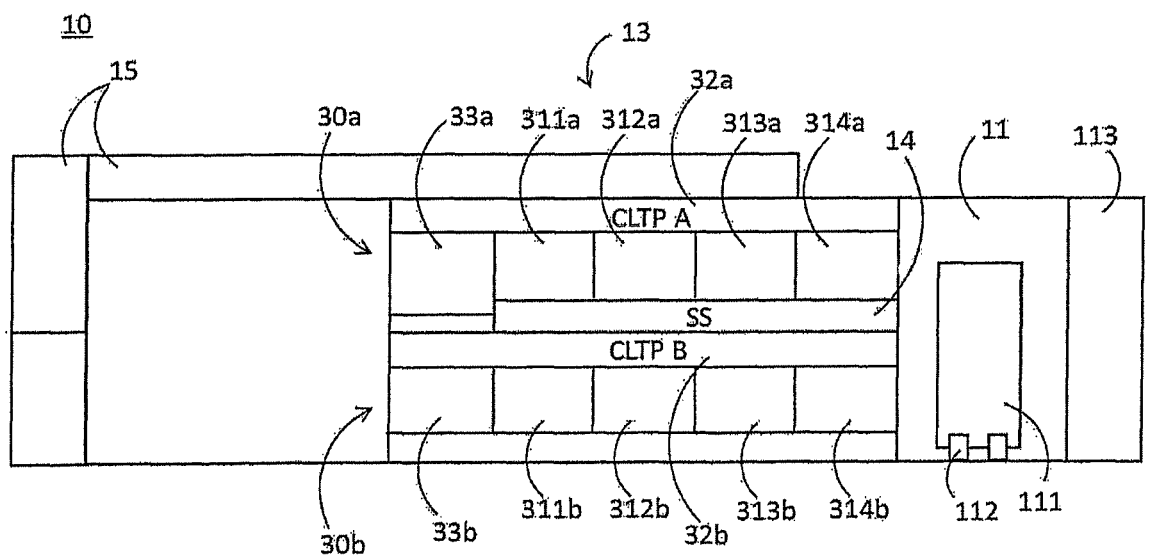
FIG. 2 is a side view of the substrate processing apparatus shown in FIG. 1 as viewed from a cleaning unit.

FIG. 1 is a plan view of the overall configuration of a substrate processing apparatus according to an embodiment, and FIG. 2 is a side view of the polishing apparatus shown in FIG. 1 as seen from the cleaning unit. As shown in FIGS. 1 and 2, a substrate processing apparatus 10 according to the present embodiment includes a substantially rectangular housing in a plan view, and the interior of the housing is partitioned by a partition wall into a load/unload unit 11, a polishing unit 12, a cleaning unit 13, and a transport unit 14. The load/unload unit 11, the polishing unit 12, the cleaning unit 13, and the transport unit 14 are independently assembled and independently evacuated. Further, the substrate processing apparatus 10 includes a control unit 15 (also referred to as a control panel) that controls the operations of the load/unload unit 11, the polishing unit 12, the cleaning unit 13, and the transport unit 14.

The load/unload unit 11 includes a plurality of (four in the illustrated example) front loading units 113 that places a wafer cassette for stocking a large number of wafers (substrates) W. These front loading units 113 are disposed adjacent to each other in the width direction (the direction orthogonal to the longitudinal direction) of the substrate processing apparatus 10. An open cassette, a standard manufacturing interface (SMIF) pod, or a front opening unified pod (FOUP) can be mounted on the front loading unit 113. Here, the SMIF and the FOUP are airtight containers which can accommodate wafer cassettes inside and which can hold an environment independent of the external space by covering the wafer cassettes with partition walls.

In addition, a traveling mechanism 112 is installed along the arrangement direction of the front loading unit 113 in the load/unload unit 11, and a transport robot 111 is installed on the traveling mechanism 112 so as to be movable along the arrangement direction of the front loading unit 113. The transport robot 111 can access the wafer cassette mounted on the front loading unit 113 by moving on the traveling mechanism 112. The transport robot 111 has two hands on the upper and lower sides. For example, the upper hand is used when returning the wafer W to the wafer cassette, and the lower hand is used when transporting the wafer W before polishing. Thus, the upper and lower hands can be used selectively.

Since the load/unload unit 11 is a region where it is necessary to maintain the cleanest state, the inside of the load/unload unit 11 is maintained at any time at a pressure higher than the pressure of any of the outside of the apparatus, the polishing unit 12, the cleaning unit 13, and the transport unit 14. In addition, a filter fan unit (not shown) having a clean air filter such as a HEPA filter or an ULPA filter is provided above the traveling mechanism 112 of the transport robot 111. This filter fan unit constantly blows downward clean air from which gas with particles and toxic steam have been removed.

The transport unit 14 is a region where the wafer before polishing is transferred from the load/unload unit 11 to the polishing unit 12, and is provided so as to extend along the longitudinal direction of the substrate processing apparatus 10. As shown in FIG. 1, the transport unit 14 is disposed adjacent to both the load/unload unit 11, which is the cleanest region, and the polishing unit 12, which is the dirtiest region. Therefore, in order to prevent the particles in the polishing unit 12 from diffusing into the load/unload unit 11 through the transport unit 14, as described later, a current of air flowing from the load/unload unit 11 side to the polishing unit 12 side is formed inside of the transport unit 14.

As shown in FIG. 1, the polishing unit 12 is a region where the wafer W is polished, and has a first polishing unit 20a having a first polishing apparatus 21a and a second polishing apparatus 21b, a second polishing unit 20b having a third polishing apparatus 21c and a fourth polishing apparatus 21d, and a polishing unit transport mechanism 22 disposed so as to be adjacent to the transport unit 14, the first polishing unit 20a, and the second polishing unit 20b. The polishing unit transport mechanism 22 is disposed between the transport unit 14 and each of the first polishing unit 20a and the second polishing unit 20b in the width direction of the substrate processing apparatus 10.

The first polishing apparatus 21a, the second polishing apparatus 21b, the third polishing apparatus 21c, and the fourth polishing apparatus 21d are disposed along the longitudinal direction of the substrate processing apparatus 10.

As shown in FIG. 1, the top ring of the first polishing apparatus 21a moves between the polishing position and a first substrate transport position TP1 by the swing motion of the top ring head, and the wafer is transferred to the first polishing apparatus 21a at the first substrate transport position TP1. Similarly, the top ring of the second polishing apparatus 21b moves between the polishing position and a second substrate transport position TP2 by the swing motion of the top ring head, and the wafer is transferred to the second polishing apparatus 21b at the second substrate transport position TP2. The top ring of the third polishing apparatus 21c moves between the polishing position and the third substrate transport position TP3 by the swing motion of the top ring head, and the wafer is transfer to the third polishing apparatus 21c at the third substrate transport position TP3. The top ring of the fourth polishing apparatus 21d moves between the polishing position and the fourth substrate transport position TP4 by the swing motion of the top ring head, and the wafer is transfer to the fourth polishing apparatus 21d at the fourth substrate transport position TP4.

The polishing unit transport mechanism 22 has a first transport unit 24a that transports the wafer W to the first polishing unit 20a, a second transport unit 24b that transports the wafer W to the second polishing unit 20b, and a transport robot 23 that is disposed between the first transport unit 24a and the second transport unit 24b, and that transfers the wafer between the transport unit 14 and each of the first transport unit 24a and the second transport unit 24b. In the illustrated example, the transport robot 23 is disposed substantially in the center of the housing of the substrate processing apparatus 10.

As shown in FIGS. 1 and 2, the cleaning unit 13 is a region where the wafer after polishing is cleaned, and has a first cleaning unit 30a and a second cleaning unit 30b disposed in upper and lower two stages. The above-described transport unit 14 is disposed between the first cleaning unit 30a and the second cleaning unit 30b. Since the first cleaning unit 30a, the transport unit 14 and the second cleaning unit 30b are disposed so as to overlap to each other in the vertical direction, an advantage that the footprint is small is obtained.

The first cleaning unit 30a has a plurality of (four in the illustrated example) cleaning modules 311a, 312a, 313a, and 314a, a wafer station 33a, and a substrate transport system 32a for transporting the wafer W between each of the cleaning modules 311a to 314a and the wafer station 33a. The plurality of cleaning modules 311a to 314a and the wafer station 33a are disposed in series along the longitudinal direction of the substrate processing apparatus 10. A filter fan unit (not shown) having a clean air filter is provided on the upper part of each of the cleaning modules 311a to 314a, and this filter fan unit constantly blows downward clean air from which gas with particles and toxic steam have been removed. The inside of the first cleaning unit 30a is maintained at any time at a pressure higher than the pressure of the polishing unit 12 in order to prevent particles from flowing in from the polishing unit 12.

Similarly, the second cleaning unit 30b has a plurality of (four in the illustrated example) cleaning modules 311b, 312b, 313b, and 314b, a wafer station 33b, and a substrate transport system 32b for transferring the wafer W between each of the cleaning modules 311b to 314b and the wafer station 33b. The plurality of cleaning modules 311b to 314b and the wafer station 33b are disposed in series along the longitudinal direction of the substrate processing apparatus 10. A filter fan unit (not shown) having a clean air filter is provided on the upper part of each of the cleaning modules 311b to 314b, and this filter fan unit constantly blows downward clean air from which gas with particles and toxic steam have been removed. The inside of the second cleaning unit 30b is maintained at any time at a pressure higher than the pressure of the polishing unit 12 in order to prevent particles from flowing in from the polishing unit 12.

Since the wafer station 33b of the second cleaning unit 30b has the same configuration as the wafer station 33a of the first cleaning unit 30a, the wafer station 33a of the first cleaning unit 30a will be described below.

Figure 3:
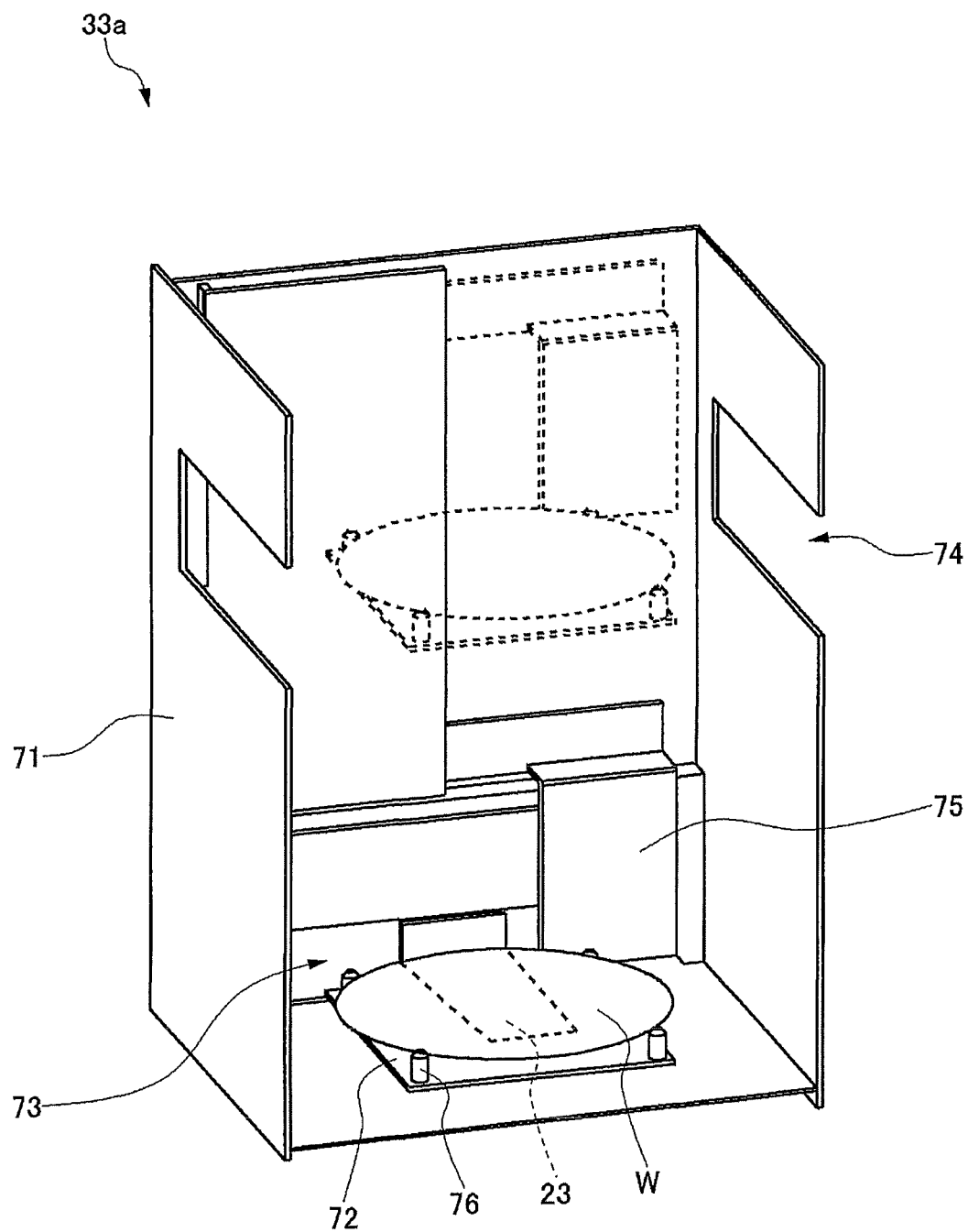
FIG. 3 is an exploded perspective view showing an internal configuration of a first wafer station of the cleaning unit shown in FIG. 1.

FIG. 3 is an exploded perspective view showing the internal configuration of the wafer station 33a. As shown in FIG. 3, the wafer station 33a has a housing 71 having a substantially rectangular parallelepiped shape, a stage 72 that is disposed inside of the housing 71 and that holds the wafer W, and a drive mechanism 75 for vertically moving the stage 72.

Among them, the housing 71 has a bottom plate, four side plates, and a top plate. As shown in FIG. 3, a carry-in port 73 communicating with the polishing unit 12 is formed at the lower end part of the side plate facing the polishing unit 12 among the four side plates. The carry-in port 73 is openable and closable by a shutter (not shown). As shown in FIG. 3, the transport robot 23 of the polishing unit 12 can access the inside of the housing 71 through the carry-in port 73.

In addition, in the remaining three side plates (that is, the side plate facing a cleaning unit transport mechanism 32a, which is later described, and the left and right side plates) among the four side plates, arm passage openings 74 through which the arm of the cleaning unit transport mechanism 32a passes are formed at a height position higher than the position of the carry-in port 73. The arm passage (for wafer transport) opening 74 is openable and closable by a shutter (not shown). As shown in FIG. 3, the cleaning unit transport mechanism 32a of the first cleaning unit 30a is accessible to the inside of the housing 71 through the arm passage opening 74.

For example, a motor driven mechanism using a ball screw or an air cylinder is used as the drive mechanism 75. The stage 72 is fixed to the movable part of the drive mechanism 75, and moves vertically between the height position facing the carry-in port 73 and the height position facing the arm passage (for wafer transport) opening 74 by the power provided from the drive mechanism 75 (see FIG. 3).

Four pins 76 are provided so as to protrude upward on the outer peripheral part of the stage 72. Therefore, the wafer W placed on the stage 72 is supported on the stage 72 in a state where its outer peripheral edge is guided and positioned by the four pins 76. These pins 76 are made of resin such as polypropylene (PP), polychlorotrifluoroethylene (PCTFE) or polyetheretherketone (PEEK).

Since the cleaning modules 311*b* to 314*b* of the second cleaning unit 30*b* have the same configuration as the cleaning modules 311*a* to 314*a* of the first cleaning unit 30*a*, the cleaning modules 311*a* to 314*a* of the first cleaning unit 30*a* will be described.

As shown in FIG. 1 and FIG. 2, four cleaning modules 311*a* to 314*a* (hereinafter possibly referred to as first to fourth cleaning modules) are disposed in series in this order from the wafer station 33*a*. Each of the cleaning modules 311*a* to 314*a* has a cleaning machine (not shown) and a housing 91 (see FIG. 7, and FIGS. 9A to 9E) that covers the cleaning machine.

For example, a roll type cleaning machine can be used as a cleaning machine of the first cleaning module 311*a* and the second cleaning module 312*a* in which roll-shaped sponges disposed vertically are rotated and pressed against the front and rear surfaces of the wafer to clean the front and rear surfaces of the wafer. For example, a pencil type cleaning machine can be used as a cleaning machine of the third cleaning module 313*a* in which while rotating a hemispherical sponge, the sponge is pressed against a wafer for cleaning. For example, a pencil type cleaning machine can be used as a cleaning machine of the fourth cleaning module 314*a*, in which the rear surface of the wafer is cleaned by rinsing and while rotating a hemispherical sponge, the sponge is pressed against the wafer to clean the front surface of the wafer. The cleaning machine of the fourth cleaning module 314*a* has a stage for rotating the chucked wafer at a high speed, and has a function (spin dry function) of drying, by rotating the wafer at high speed, the wafer after cleaning. In addition to the roll type cleaning machine and the pencil type cleaning machine as described above, a cleaning machine of each of the cleaning modules 311*a* to 314*a* may be additionally provided with a megasonic type cleaning machine that performs washing by applying ultrasonic waves to the washing liquid.

The housing 91 of each of the cleaning modules 311*a* to 314*a* has a bottom plate, four side plates, and a top plate as in the housing 71 of the wafer station 33*a*. Arm passage openings 94 through which the arm of the cleaning unit transport mechanism 32*a* passes are formed in the side plate facing the cleaning unit transport mechanism 32*a* and the left and right side plates among the four side plates. The arm passage opening 94 is openable and closable by a shutter 97. The height position of the arm passage opening 94 is the same as the height position of the arm passage opening 74 of the wafer station 33*a*. The cleaning unit transport mechanism 32*a* is accessible to the inside of the housing 91 through the arm passage opening 94.

<Substrate Transport System>

Next, the configuration of the substrate transport systems 32*a* and 32*b* will be described. The configuration of the substrate transport system 32*b* of the second cleaning unit 30*b* is the same as the configuration of the substrate transport system 32*a* of the first cleaning unit 30*a*, and the substrate transport system 32*a* of the first cleaning unit 30*a* will be described below.

Figure 4:
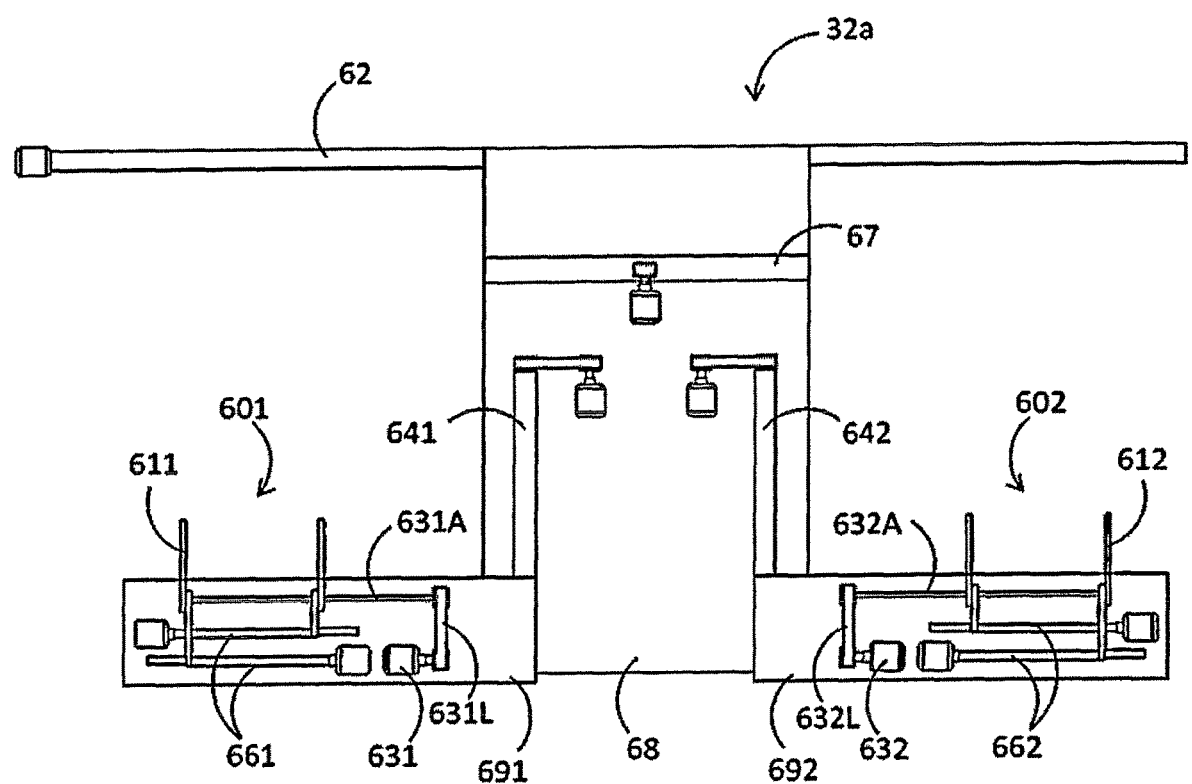
FIG. 4 is a schematic view showing a schematic configuration of a substrate transport system.

FIG. 4 is a diagram showing a schematic configuration of the substrate transport system 32*a*. As shown in FIG. 4, the substrate transport system 32*a* has a first hand 601 and a second hand 602 which hold respective wafers W, and a first electric actuator 62 that linearly moves the first hand 601 and the second hand 602 along the arrangement direction of the plurality of cleaning modules 311*a* to 314*a* (hereinafter, possibly referred to as a first axis direction). That is, in the present embodiment, the number of the hands 601 and 602 is smaller than the number of the cleaning modules 311*a* to 314*a*.

In the present embodiment, for example, the first hand 601 and the second hand 602 can be selectively used according to the cleanliness of the wafer W. For example, among the first to fourth cleaning modules 311*a* to 314*a*, the first cleaning module 311*a* and the second cleaning module 312*a* in the first half of the cleaning process use the first hand 601, and the third cleaning module 313*a* and the fourth cleaning module 314*a* in the second half of the cleaning process use the second hand 602, whereby it is possible to prevent the wafer W in the second half of the cleaning process from being contaminated by coming into contact with the first hand 601.

More specifically the first hand 601 has a pair of openable and closable arms 611 that holds a wafer, a third electric actuator 641 that linearly moves the pair of arms 611 along a vertical direction (hereinafter, possibly referred to as a third axis direction) a rotating mechanism 631 for rotating the pair of arms 611 around a rotation shaft 631A parallel to the opening and closing direction, an opening and closing mechanism 661 for opening and closing the pair of arms 611 toward each other or away from each other.

Similarly, a second hand 602 has a pair of openable and closable arms 612 that holds a wafer, a third electric actuator 642 that linearly moves the pair of arms 612 in the vertical direction (third axis direction) a rotating mechanism 632 for rotating the pair of arms 612 about a rotation shaft 632A parallel to the opening and closing direction, and an opening and closing mechanism 662 for opening and closing the pair of arms 612 toward each other or away from each other.

For example, a motor driven mechanism using a ball screw is used as the first electric actuator 62. As shown in FIG. 4, the ball screw of the first electric actuator 62 is provided above the cleaning modules 311*a* to 314*a* so as to extend in the arrangement direction (first axis direction) of the cleaning modules 311*a* to 314*a*.

A main frame 68 is attached to the ball screw of the first electric actuator 62. The main frame 68 is attached so as to hang downward from the ball screw of the first electric actuator 62, and faces the side faces of the cleaning modules 311*a* to 314*a*. By the driving of the motor connected to the ball screw of the first electric actuator 62, the main frame 68 is linearly moved along the arrangement direction (first axis direction) of the cleaning modules 311*a* to 314*a* while the main frame 68 faces the side faces of the cleaning modules 311*a* to 314*a*.

In the illustrated example, the main frame 68 has a second electric actuator 67 for adjusting the position in the depth direction (the direction orthogonal to both the arrangement direction of the cleaning modules 311*a* to 314*a* and the vertical direction (hereinafter, possibly referred to as a second axis direction)). For example, a motor driven mechanism using a rack and pinion is used as the second electric actuator 67. The position of the main frame 68 in the depth direction is adjusted by the driving of the second electric actuator 67.

The third electric actuators 641 and 642 are provided on the main frame 68. For example, a motor driven mechanism using a ball screw is used as the third electric actuators 641 and 642. As shown in FIG. 4, the ball screw of the third electric actuator 641 related to the first hand 601 is attached so as to extend in the vertical direction at the left end part of the main frame 68, and the ball screw of the third electric actuator 642 related to the second hand 602 is attached so as to extend in the vertical direction at the right end part of the main frame 68.

A sub frame 691 supporting the pair of arms 611 is attached to the ball screw of the third electric actuator 641 related to the first hand 601. The sub frame 691 is provided on the left side of the main frame 68 so as to be adjacent to the main frame 68, and faces the side faces of the cleaning modules 311a to 314a. The sub frame 691 is linearly moved in the vertical direction by the driving of the motor connected to the ball screw of the third electric actuator 641.

Similarly, a sub frame 692 supporting the pair of arms 612 is attached to the ball screw of the third electric actuator 642 related to the second hand 602. The sub frame 692 is provided on the right side of the main frame 68 so as to be adjacent to the main frame 68, and can face the side face of the cleaning modules 311a to 314a. The sub frame 692 is linearly moved in the vertical direction by the driving of the motor connected to the ball screw of the third electric actuator 642.

Figure 5:
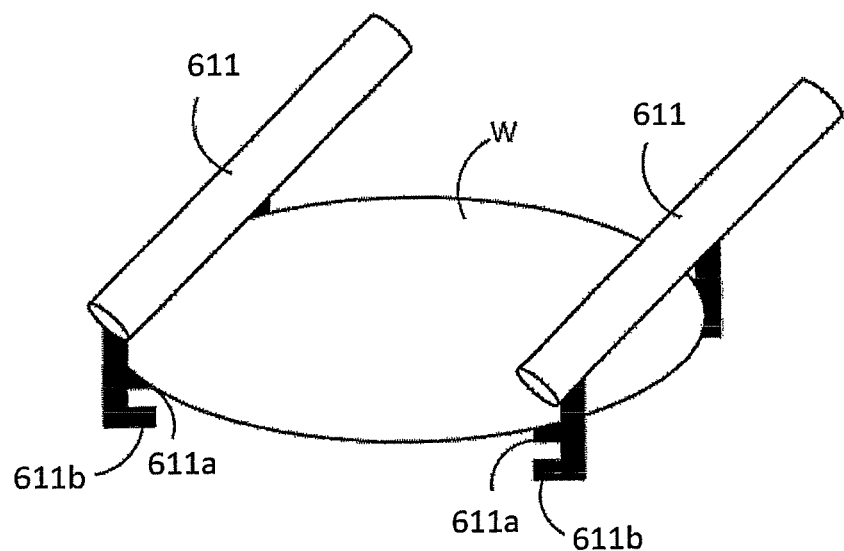
FIG. 5 is a perspective view showing a state in which a first hand of the substrate transport system shown in FIG. 4 holds a substrate with an upper chuck top.
Figure 6:
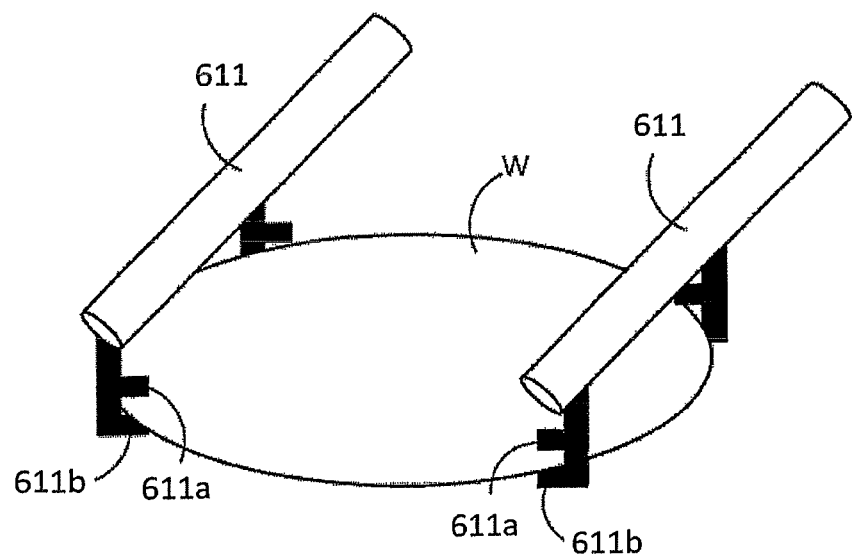
FIG. 6 is a perspective view showing a state in which the first hand of the substrate transport system shown in FIG. 4 holds the substrate with a lower chuck top.

As shown in FIGS. 5 and 6, chuck tops 611a and 611b each having a tapered part capable of contacting the outer peripheral part of the wafer W are provided in upper and lower two stages on the pair of arms 611 of the first hand 601. For example, the wafer W having a relatively high cleanliness is held by the taper part of the upper chuck top 611a, the wafer having a relatively low cleanliness is held by the taper part of the lower chuck top 611b, so that the lower chuck top 611b comes into contact with the wafer W with high cleanliness, and it is possible to prevent the wafer W from being contaminated.

Although illustration is omitted, similarly, chuck tops having tapered parts capable of contacting the outer peripheral part of the wafer W are provided in upper and lower two stages on the pair of arms 612 of the second hand 602. For example, the wafer W having a relatively high degree of cleanliness is held by the taper part of the upper chuck top, and a wafer having a relatively low cleanliness is held by the taper part of the lower chuck top, so that the lower chuck top comes into contact with the wafer W with high cleanliness, and it is possible to prevent the wafer W from being contaminated.

First Embodiment

Figure 7:
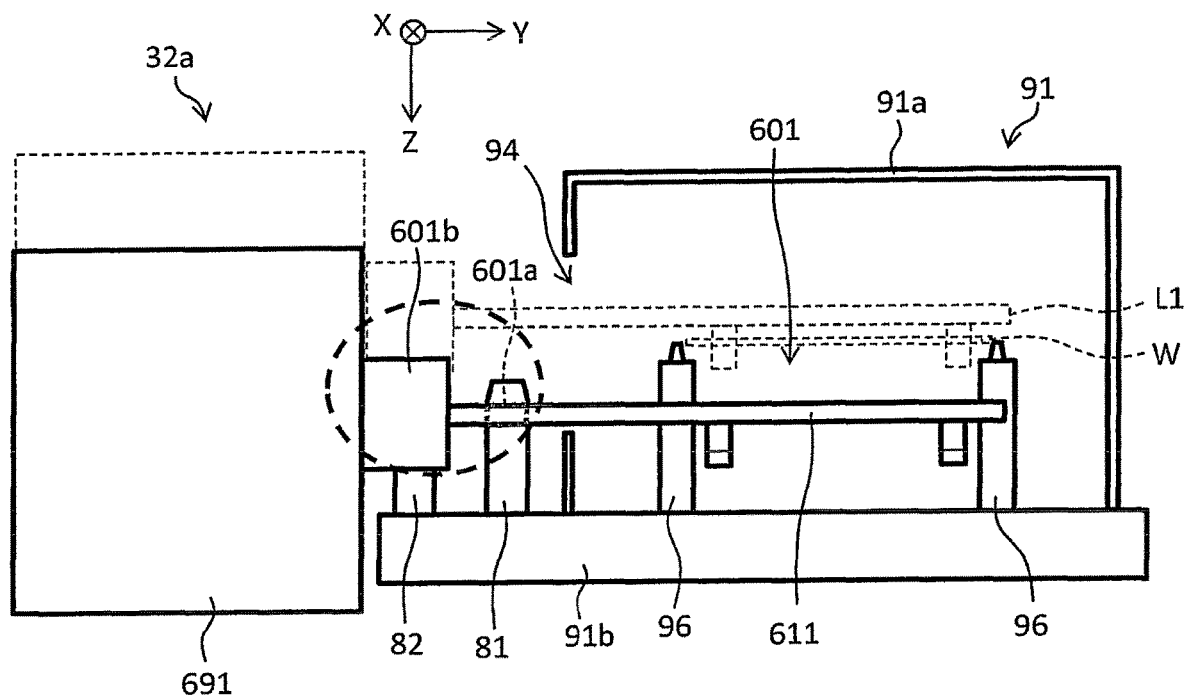
FIG. 7 is an internal configuration view of the first hand and a cleaning module of the substrate transport system shown in FIG. 4 as viewed from a first axis direction.
Figure 8A:
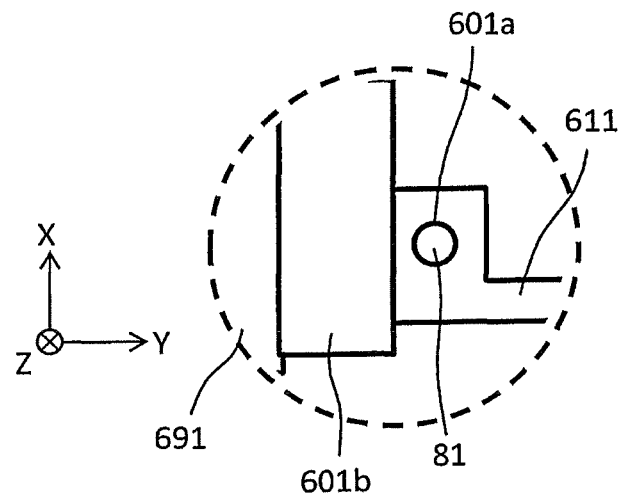
FIG. 8A is an enlarged top view of a region surrounded by a broken line of the first hand shown in FIG. 7.

Next, with reference to FIG. 7 and FIG. 8A, a configuration related to teaching of the substrate transfer position will be described. FIG. 7 is an internal configuration view of the first hand 601 and the cleaning module as viewed from the first axis direction. FIG. 8A is an enlarged top view showing a region surrounded by a broken line of the first hand 601 shown in FIG. 7. In FIG. 7, the depth direction of the page is the positive direction of the X axis, the rightward direction of the page is the positive direction of the Y axis, and the downward direction of the page is the positive direction of the Z axis. In FIG. 8A, the upward direction of the page is the positive direction of the X axis, the rightward direction of the page is the positive direction of the Y axis, and the depth direction of the page is the positive direction of the Z axis. The configuration related to the teaching of the first hand 601 is similar to the configuration related to the teaching of the second hand 602, and the configuration related to the teaching of the first hand 601 will be described below.

As described above, each of the cleaning modules 311a to 314a is partitioned by the housing 91 so as to prevent the used fluid from scattering to the outside during the cleaning of the wafer W. The housing 91 has a bottom plate, four side plates, and a top plate. Hereinafter, the bottom plate of the housing 91 is possibly referred to as a base 91b, and the four side plates and the top plate are possibly collectively referred to as a cover 91a. As shown in FIG. 7, the cover 91a is provided on the base 91b so as to surround the substrate transfer position of each of the cleaning modules 311a to 314a (a predetermined raised position L1 of a hand 601 indicated by a thin broken line in FIG. 7, that is, the position of the wafer W in FIG. 9E, to be described later, in the actual transport operation of the wafer W after teaching), and the arm passage opening 94 is formed on the side face of the cover 91a.

In the illustrated example, a plurality (for example, four) of substrate support pins 96 are provided on a base 91b so as to protrude upward. With regard to the wafers W to be carried in/carried out from the cleaning modules 311a to 314a, at the substrate transfer position, the pair of arms 611 are opened by the opening and closing mechanism 661 at the time of carrying-in, so that the outer peripheral edge of the wafer W is guided by the protrusion at the top of the substrate support pin 96 away from the chuck tops 611a and 611b and is supported by the support face at the upper part of the substrate support pin 96, and the pair of arms 611 are closed by the opening and closing mechanism 661 at the time of carrying-out, so that the outer peripheral edge of the wafer W is held by the chuck tops 611a and 611b. The substrate support pin 96 is made of resin such as polypropylene (PP), polychlorotrifluoroethylene (PCTFE) or polyetheretherketone (PEEK).

As shown in FIG. 7, a main positioning member 81 and a sub positioning member 82 are permanently mounted on the base 91b. Here, "permanently mounted" means that the main positioning member 81 and the sub positioning member 82 are at any time mounted not only at the time of teaching but also at the time of substrate transfer. The main positioning member 81 and the sub positioning member 82 may be formed of a member integral with the base 91b or formed of a member separate from the base 91b and assembled to the base 91b. In the case where the main positioning member 81 and the sub positioning member 82 are formed of a member separate from the base 91b, it is desirable to reduce intervening parts so as to minimize variations in height with respect to the substrate transfer position, and it is more desirable to directly assemble the main positioning member 81 and the sub positioning member 82 to the base 91b.

The main positioning member 81 is disposed outside of the transport route. Further, the sub positioning member 82 is also disposed outside of the transport route. Therefore, it is possible to prevent the hand 601 from interfering with the main positioning member 81 and the sub positioning member 82 even if the main positioning member 81 and the sub positioning member 82 are not detached from the base 91b at the time of substrate transfer.

When the hand 601 is moved in the first axis direction and the second axis direction (that is, in the horizontal two axes directions) the main positioning member 81 is engageable with an engagement part 601a provided in the hand 601 at a position which is offset by the first design value (+ΔX, hereinafter, possibly referred to as the first distance) in the first axis direction, and is offset by the second design value (+ΔY, hereinafter, possibly referred to as the second distance) in the second axis direction from the substrate transfer position. In the illustrated example, the main positioning member 81 has a boss and the engagement part 601a has a hole engageable with the boss. However, the present invention is not limited thereto, and the engagement part 601a may include a boss, and the main positioning member 81 may have a hole engageable with the boss. In order to allow the boss to be easily inserted into the hole, it is preferable that the distal end of the boss have a tapered shape.

Figure 8B:
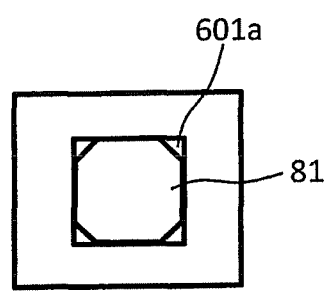
FIG. 8B is a diagram for explaining shapes of a boss and a hole according to a modification.

In the example shown in FIG. 8A, both the cross-sectional shapes of the boss and the hole are round, but it is not limited to this as long as the boss and the hole are engageable with each other. For example, as shown in FIG. 8B, the boss may have an octagonal cross section, and the hole may have a rectangular cross section. As shown in FIG. 8B, when the boss and the hole have a polygonal cross section and two or more faces are engaged with each other by being brought into contact with each other, the direction (angle) of the hand at the time of engagement is restricted, so that the present embodiment can be applied to a robot having the θ axis.

As shown in FIG. 7, when the hand 601 is moved in the third axis direction (that is, vertical direction), the sub positioning member 82 can be brought into contact with a contact part 601b provided on the hand 601 at a position which is offset from the substrate transfer position by the third design value (+ΔZ, hereinafter, possibly referred to as the third distance) in the third axis direction. In order to increase the rigidity of the contact part 601b, it is desirable that the proximal end of the hand 601 is thicker than the distal end of the hand 601. It should be noted that the descended position of the hand 601 shown in solid line in FIG. 7 is a position at which the hand 601 is in contact (positioned) with the sub positioning member 82 in a state of being engaged with the main positioning member 81.

In the illustrated example, when the hand 601 is moved in the third axis direction (vertical direction), the sub positioning member 82 is positioned so as to be brought into contact with the contact part 601b of the hand 601 before the hand 601 comes into contact with the edge of the opening 94. Thus, when the hand 601 is moved in the third axis direction (vertical direction), it is possible to prevent the hand 601 from being damaged by being brought into contact with the edge of the opening 94.

In the illustrated example, the main positioning member 81 is disposed outside of the cover 91a, but it is not limited thereto, and the main positioning member 81 may be disposed inside of the cover 91a. Similarly, in the illustrated example, the sub positioning member 82 is disposed outside of the cover 91a, but it is not limited thereto, and the sub positioning member 82 may be disposed inside of the cover 91a.

Figure 11A:
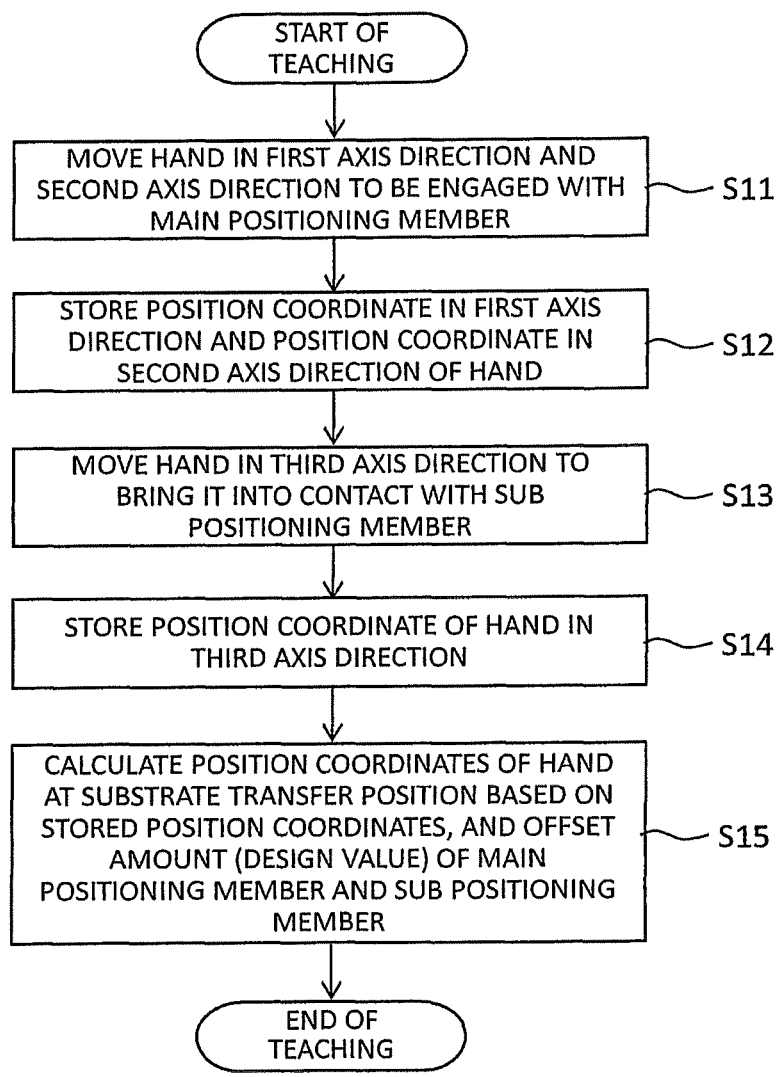
FIG. 11A is a flowchart showing an example of a method of teaching a substrate transfer position in the substrate transport system shown in FIG. 4.

Next, referring to FIG. 11A, an example of a method for teaching a substrate transfer position in the substrate transport system 32a having such a configuration will be described.

First, for example, an operator (user) manually engages the engagement part 601a of the hand 601 with the main positioning member 81 on the base 91b at the position which is offset by a first distance (+ΔX) in the first axis direction and is offset by the second distance (+ΔY) in the second axis direction from the substrate transfer position (step S11).

Thus, the hand 601 is surely positioned at a predetermined position in the first axis direction and the second axis direction.

In a state where the engagement part 601a of the hand 601 is engaged with the main positioning member 81, the control unit 15 acquires the position coordinate ($X_1$) in the first axis direction and the position coordinate ($Y_1$) in the second axis direction of the hand 601 from an encoder (not shown) to store them (step S12).

Next, for example, the operator manually moves the hand 601 in the third axis direction (vertical direction), and causes the contact part 601b of the hand 601 to come into contact with the sub positioning member 82 on the base 91b at a position which is offset from the substrate transfer position by the third distance (+ΔZ) in the third axis direction (step S13). As a result, the hand 601 is surely positioned at a predetermined position in the third axis direction.

In a state where the contact part 601b of the hand 601 is brought into contact with the sub positioning member 82, the control unit 15 acquires the position coordinate ($Z_1$) of the hand 601 in the third axis direction from the encoder to store it (not shown) (Step S14).

The control unit 15 calculates the position coordinate ($X_1$-ΔX) in the first axis direction of the hand at the substrate transfer position based on the stored position coordinate ($X_1$) in the first axis direction and the first distance (+ΔX) which is the offset amount of the main positioning member 81. Similarly, the control unit 15 calculates the position coordinate ($Y_1$-ΔY) in the second axis direction of the hand at the substrate transfer position based on the second distance (+ΔY) which is the offset amount between the stored position coordinate ($Y_1$) in the second axis direction and the main positioning member 81. The control unit 15 calculates the position coordinate ($Z_1$-ΔZ) in the second axis direction of the hand at the substrate transfer position based on the third distance (+ΔZ) which is the offset amount between the stored position coordinate ($Z_1$) in the third axis direction and the sub positioning member 82 (step S15).

Thereafter, the control unit 15 controls the first to third electric actuators 62, 67, and 641 to cause the first to third electric actuators 62, 67, and 641 to move the hand 601 to the position coordinates ($X_1$-ΔX, $Y_1$-ΔY, $Z_1$-ΔZ) of the calculated substrate transfer position. At this time, since the main positioning member 81 and the sub positioning member 82 are disposed outside of the transport route, it is possible to move the hand 601 to the substrate transfer position without interfering with the main positioning member 81 and the sub positioning member 82 even if the main positioning member 81 and the sub positioning member 82 are not detached from the base 91b. As a result, the hand 601 can be positioned at the substrate transfer position in a short time and accurately.

Next, with reference to FIGS. 9A to 9E, an example of a method for transferring a wafer W by the substrate transport system 32a to which the substrate transfer position has been taught will be described.

Figure 9A:
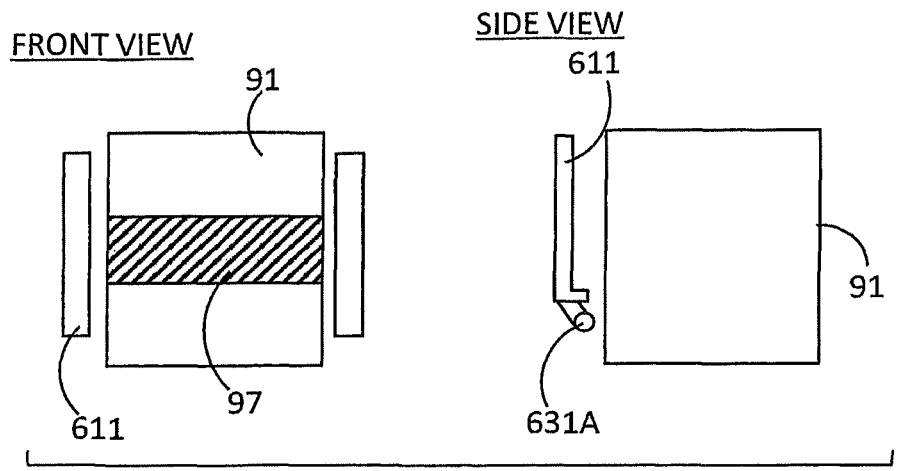
FIG. 9A is a schematic diagram for explaining the operation of the first hand of the substrate transport system shown in FIG. 4.

First, when taking out the cleaned wafer W from the housing 91, as shown in FIG. 9A, the control unit 15 controls the first electric actuator 62 to cause the first electric actuator 62 to moves the pair of arms 611 whose tips are directed upward to a waiting position adjacent to the housing 91. In the present embodiment, even when the shutter 97 of the housing 91 is closed, the pair of arms 611 can be moved to the waiting position adjacent to the housing 91 by placing the tips of the pair of arms 611 upward. Therefore, it is possible to make the start timing of the wafer take-out operation faster to improve the throughput of the whole process.

Figure 9B:
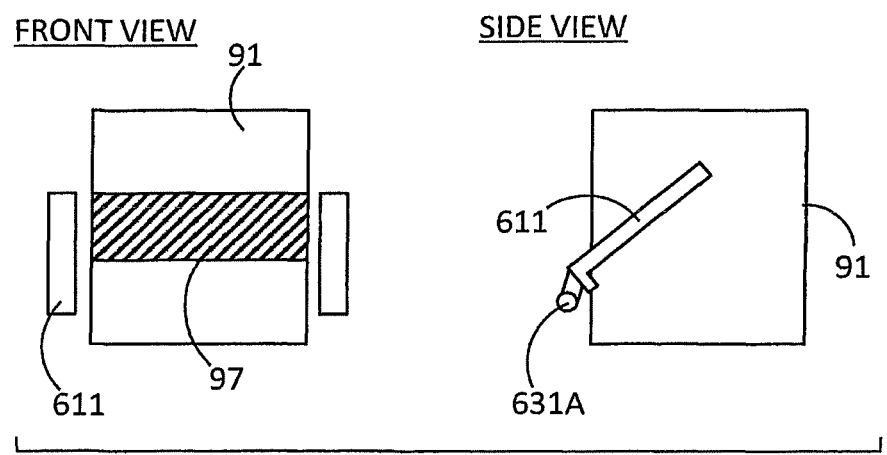
FIG. 9B is a schematic diagram for explaining the operation of the first hand of the substrate transport system shown in FIG. 4.
Figure 9C:
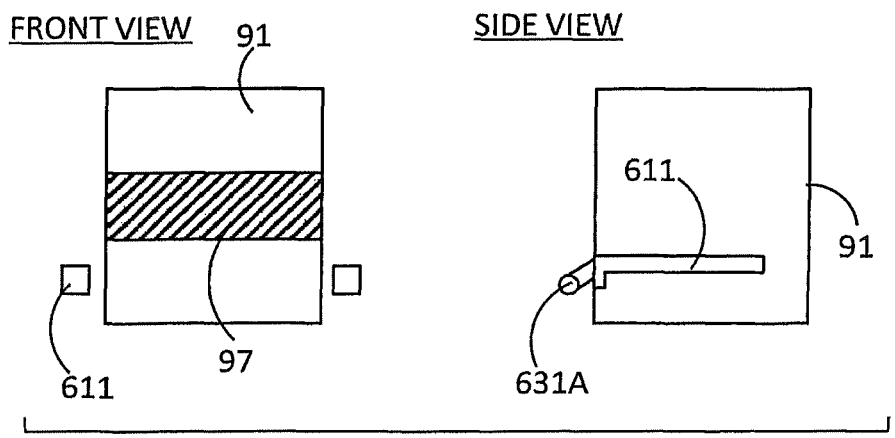
FIG. 9C is a schematic diagram for explaining the operation of the first hand of the substrate transport system shown in FIG. 4.

Next, as shown in FIGS. 9B and 9C, the control unit 15 controls the rotating mechanism 631 to cause the rotating mechanism 631 to rotate the pair of arms 611 around the rotation shaft 631A. In the illustrated example, the pair of arms 611 are rotated clockwise by 90° about the rotation shaft 631A in the side view, and the tips of the pair of arms 611 are directed sideways.

Figure 9D:
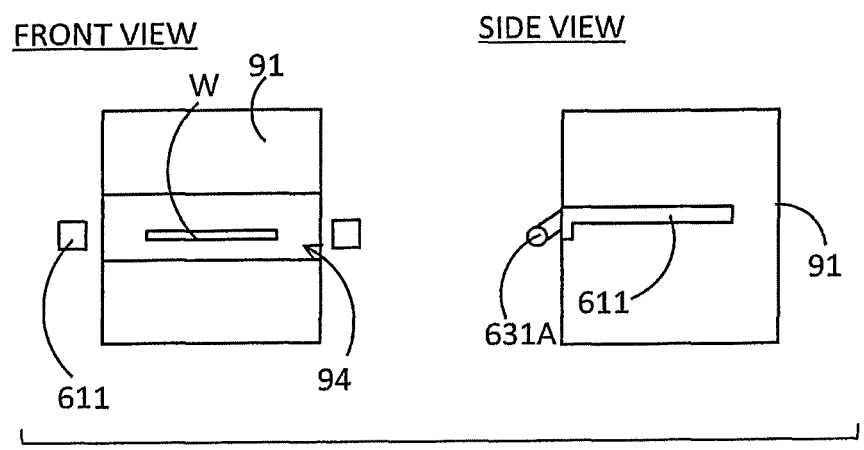
FIG. 9D is a schematic diagram for explaining the operation of the first hand of the substrate transport system shown in FIG. 4.

Next, as shown in FIG. 9D, the control unit 15 controls the third electric actuator 641 to cause the third electric actuator 641 to raise the pair of arms 611 to the height position same as that of the arm passage opening 94. At this time, the shutter 97 is retracted and the arm passage opening 94 is opened.

Figure 9E:
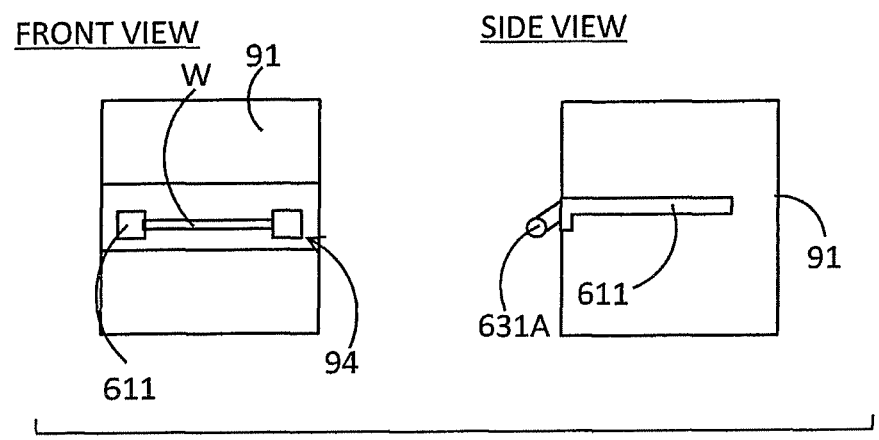
FIG. 9E is a schematic diagram for explaining the operation of the first hand of the substrate transport system shown in FIG. 4.

Next, as shown in FIG. 9E, the control unit 15 controls the opening and closing mechanism 661 to cause the opening and closing mechanism 661 to move the pair of arms 611 toward each other, and to cause the arms 611 to be inserted into the housing 91 through the arm passage opening 94, whereby the arms 611 holds the wafer W in the housing 91. Then, the control unit 15 controls the first electric actuator 62 to cause the first electric actuator 62 to move the pair of arms 611 holding the wafer W to the next cleaning module.

In the case of loading the wafer W before cleaning inside of the housing 91, the above-described operation shown in FIGS. 9A to 9E are performed in the reverse order. That is, as shown in FIG. 9E, the control unit 15 controls the first electric actuator 62 to cause the first electric actuator 62 to move the pair of arms 611 holding the wafer W to the inside of the housing 91 through the arm passage opening 94.

Next, as shown in FIG. 9D, the control unit 15 controls the opening and closing mechanism 661 to cause the opening and closing mechanism 661 to move the pair of arms 611 in a direction away from each other, and then to move the arms 611 outside of the housing 91 through the arm passage opening 94.

Next, as shown in FIG. 9C, the control unit 15 controls the third electric actuator 641 to cause the third electric actuator 641 to lower the pair of arms 611 to a position lower than that of the arm passage opening 94. At this time, the arm passage opening 94 is closed by the shutter 97, and the cleaning process of the wafer W is started inside of the housing 91.

Next, as shown in FIGS. 9B and 9A, the control unit 15 controls the rotating mechanism 631 to cause the rotating mechanism 631 to rotate the pair of arms 611 about the rotation shaft 632A. In the illustrated example, the pair of arms 611 are rotated 90° counterclockwise about the rotation shaft 631A in the side view, and the tips of the pair of arms 611 is directed upward. Then, the control unit 15 controls the first electric actuator 62 to cause the first electric actuator 62 to move the pair of arms 611 whose tips are directed upward to the next cleaning module. In the present embodiment, when the rotating mechanism 631 rotates the pair of arms 611 so that their tips are directed upward, the third electric actuator 641 lowers the pair of arms 611, so that it is possible to reduce the space required above the pair of arms 611.

Next, with reference to FIGS. 10A to 10F, an example of the process of cleaning the wafer W in the cleaning unit 13 will be described. In the present embodiment, the wafers W transported from the polishing unit 12 to the cleaning unit 13 are distributed by the transport robot 23 to the first cleaning unit 30a and the second cleaning unit 30b, and are cleaned in parallel by the first cleaning unit 30a and the second cleaning unit 30b. Therefore, the throughput of the whole process can be improved.

Since the wafer cleaning process in the second cleaning unit 30b is the same as the wafer cleaning process in the first cleaning unit 30a, the wafer cleaning process in the first cleaning unit 30a will be described below.

Figure 10A:
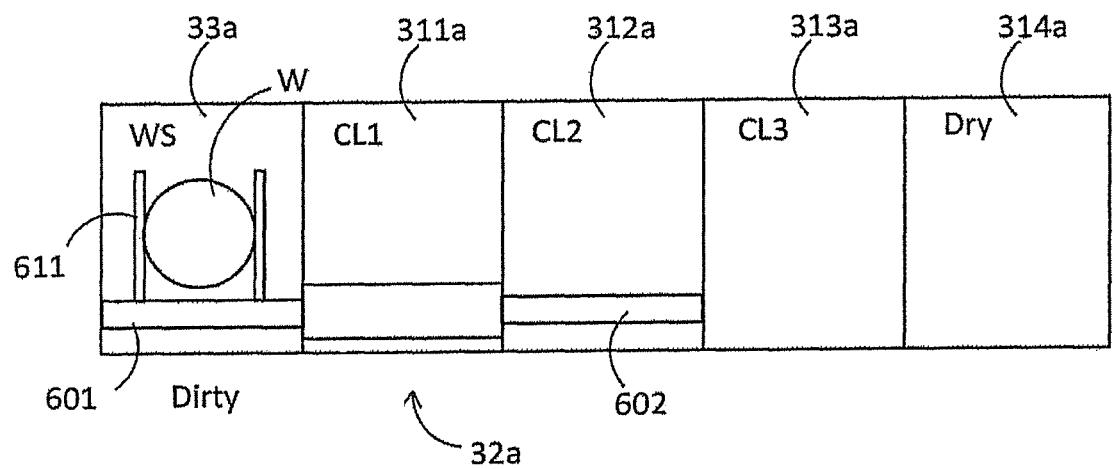
FIG. 10A is a schematic diagram for explaining the operation of a first cleaning unit.

As shown in FIG. 10A, first, in a state where the pair of arms 611 of the first hand 601 and the pair of arms 612 of the second hand 602 are directed upward, the first hand 601 and the second hand 602 are moved along the arrangement direction of the first cleaning modules 311a to 314a (that is, the first axis direction) by the driving of the first electric actuator 62, and the pair of arms 611 of the first hand 601 are stationary at the waiting position adjacent to the first wafer station 33a. Then, the pair of arms 611 of the first hand 601 are rotated around the rotation shaft 631A by the driving of the rotating mechanism 631, and the tips of the pair of arms 611 are directed sideways. After the shutter of the first wafer station 33a is retracted and the arm passage opening 74 is opened, the pair of arms 611 of the first hand 601 are inserted into the first wafer station 33a through the arm passage opening 74, and holds the wafer W held on the stage 72. After the wafer W is held by the pair of arms 611 of the first hand 601, the stage 72 is retracted downward.

Figure 10B:
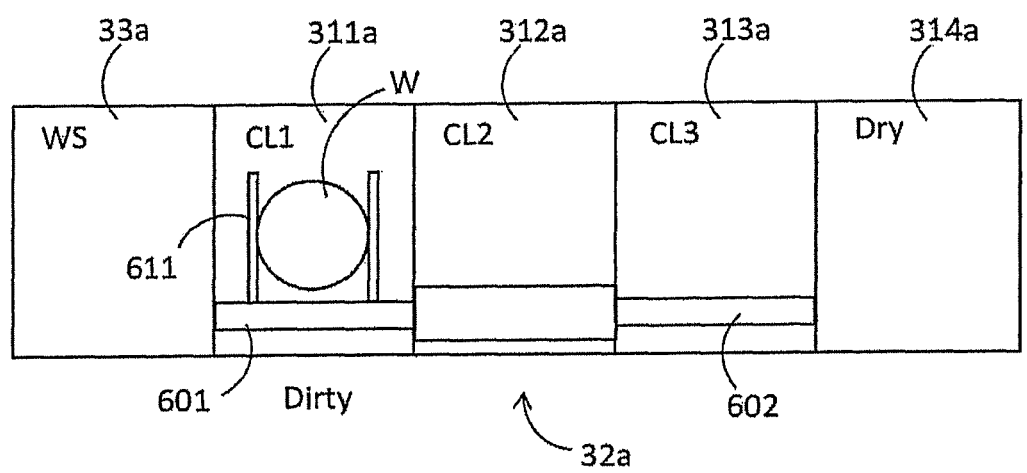
FIG. 10B is a schematic diagram for explaining the operation of the first cleaning unit.

Next, as shown in FIG. 10B, after the shutter 97 of a first cleaning module 331a is retracted and the arm passage opening 94 is opened, the first hand 601 and the second hand 602 are moved along the arrangement direction (first axis direction) of the cleaning modules 311a to 314a by the driving of the first electric actuator 62, and the wafer W held by the pair of arms 611 of the first hand 601 is transported from the first wafer station 33a to the first cleaning module 331a and is transferred to the cleaning machine of the first cleaning module 331a. Next, after the pair of arms 611 of the first hand 601 are put out to the outside of the housing 91 of the first cleaning module 331a, the arm passage opening 94 is closed by the shutter 97, and the wafer W is cleaned by the cleaning machine of the first cleaning module 331a.

After the cleaning process in the first cleaning module 331a is completed, the shutter 97 is retracted, and the arm passage opening 94 is opened. The pair of arms 611 of the first hand 601 is inserted inside of the housing 91 of the first cleaning module 331a through the arm passage opening 94, and holds the wafer W cleaned by the cleaning machine.

Figure 10C:
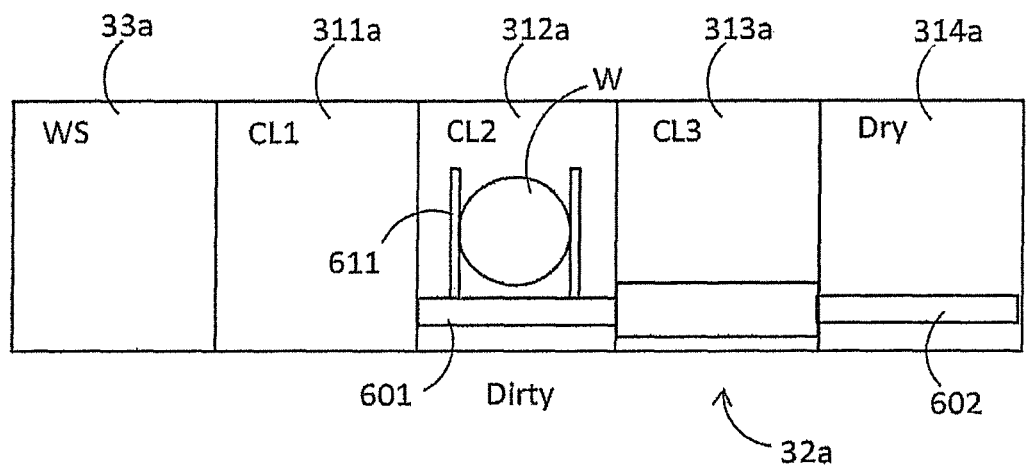
FIG. 10C is a schematic diagram for explaining the operation of the first cleaning unit.

Next, as shown in FIG. 10C, after the shutter 97 of a second cleaning module 332a is retracted, and the arm passage opening 94 is opened, the first hand 601 and the second hand 602 are moved along the arrangement direction (first axis direction) of the cleaning modules 311a to 314a by driving the first electric actuator 62, the wafer W held by the pair of arms 611 of the first hand 601 is transported from the first cleaning module 331a to the second cleaning module 332a, and is transferred to the cleaning machine of the second cleaning module 332a. Next, after the pair of arms 611 of the first hand 601 are put out to the outside of the housing 91 of the second cleaning module 332a, the arm passage opening 94 is closed by the shutter 97, and the wafer W is cleaned by the cleaning machine of the second cleaning module 332a.

Figure 10D:
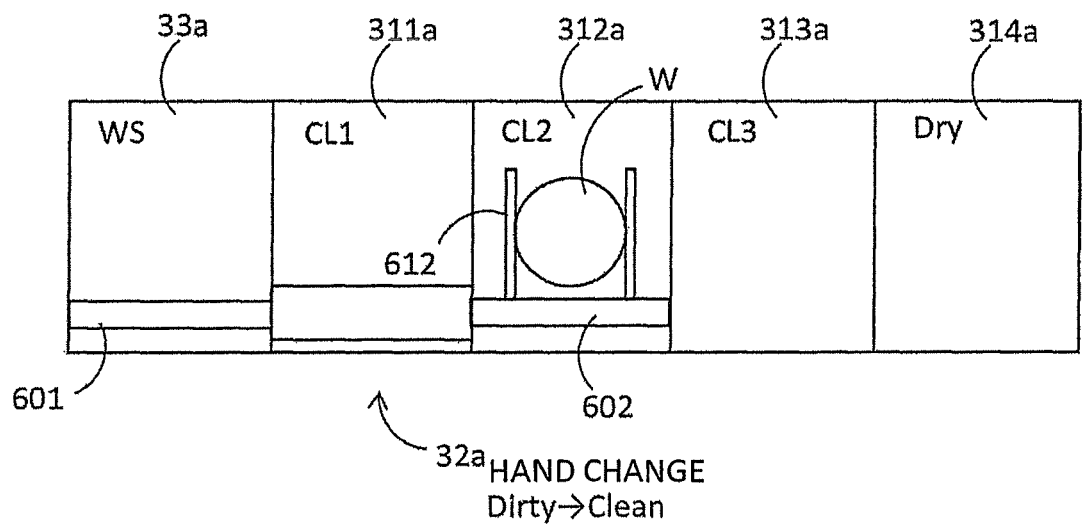
FIG. 10D is a schematic diagram for explaining the operation of the first cleaning unit.

Next, as shown in FIG. 10D, the pair of arms 611 are rotated about the rotation shaft 631A by the driving of the rotating mechanism 631 of the first hand 601, and the tips of the pair of arms 611 are directed upward. Then, in a state where the pair of arms 611 of the first hand 601 and the pair of arms 612 of the second hand 602 facing upward, the first hand 601 and the second hand 602 are moved along the arrangement direction (the first axis direction) of the first cleaning modules 311a to 314a by the driving of the first electric actuator 62, and the pair of arms 612 of the second hand 602 are stationary at the waiting position adjacent to the second cleaning module 332a. The pair of arms 612 are rotated about the rotation shaft 632A by the driving of the rotating mechanism 632 of the second hand 602, and the tip of the pair of arms 612 are directed sideways.

After the cleaning process in the second cleaning module 332a is completed, the shutter 97 is retracted and the arm passage opening 94 is opened. The pair of arms 612 of the second hand 602 is inserted inside of the housing 91 of the second cleaning module 332a through the arm passage opening 94, and holds the wafer W cleaned by the cleaning machine.

As described above, in the present embodiment, the wafer W before cleaning in the second cleaning module 332a is held and transported by the pair of arms 611 of the first hand 601, and the wafer W after cleaning in the second cleaning module 332a W is held and transported by the pair of arms 612 of the second hand 602. That is, the hand is replaced in the second cleaning module 332a. In this way, it is possible to prevent the wafer W from being contaminated by the pair of arms 611 of the first hand 601 being brought into contact with the wafer W after cleaning in the second cleaning module 332a.

Figure 10E:
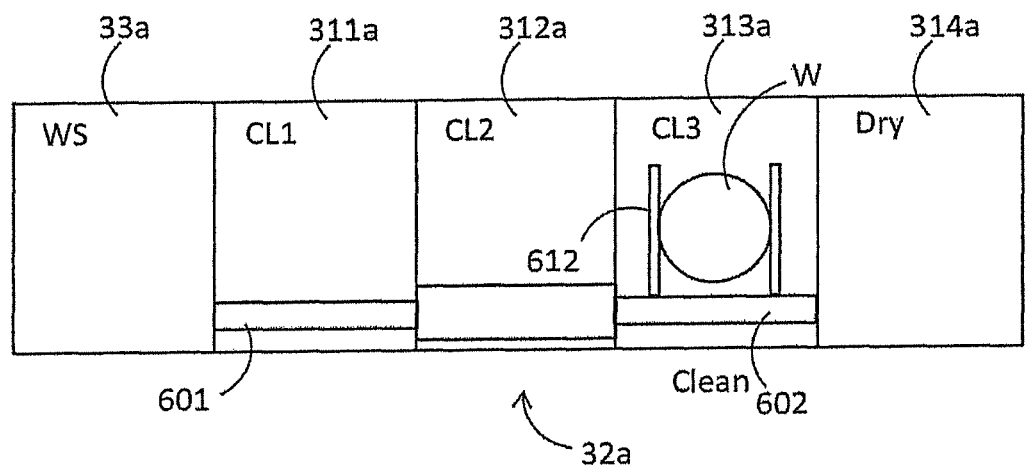
FIG. 10E is a schematic diagram for explaining the operation of the first cleaning unit.

Next, as shown in FIG. 10E, after the shutter 97 of a third cleaning module 333a is retracted and the arm passage opening 94 is opened, the first hand 601 and the second hand 602 are moved along the arrangement direction (first axis direction) of the cleaning modules 311a to 314a, by the driving of the first electric actuator 62, and the wafer W held by the pair of arms 612 of the second hand 602 is transported from the second cleaning module 332a to the third cleaning module 333a, and is transferred to the cleaning machine of the third cleaning module 333a. Then, after the pair of arms 612 of the second hand 602 are put out to the outside of the housing 91 of the third cleaning module 333a, the arm passage opening 94 is closed by the shutter 97, and the wafer W is cleaned by the cleaning machine of the third cleaning module 333a.

After the cleaning process in the third cleaning module 333a is completed, the shutter 97 is retracted and the arm passage opening 94 is opened. The pair of arms 612 of the second hand 602 is inserted inside of the housing 91 of the third cleaning module 333a through the arm passage opening 94, and holds the wafer W cleaned by the cleaning machine.

Figure 10F:
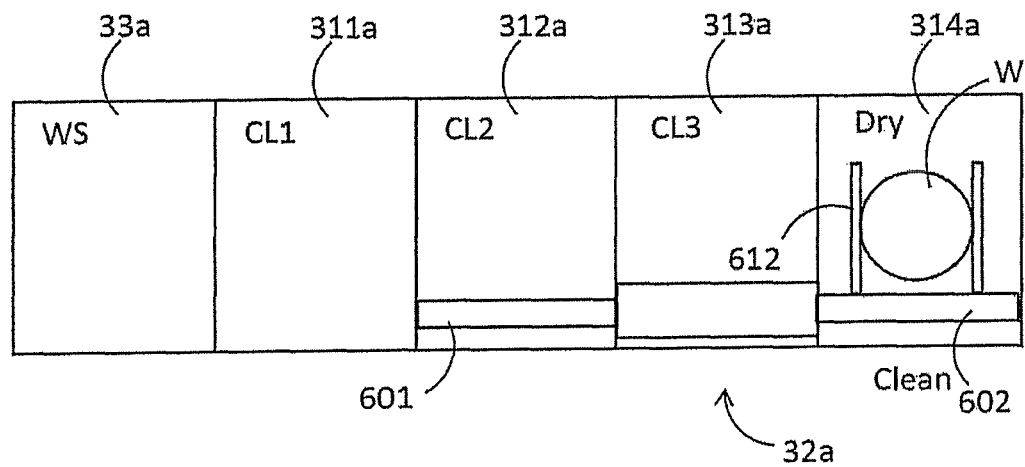
FIG. 10F is a schematic diagram for explaining the operation of the first cleaning unit.

Next, as shown in FIG. 10F, after the shutter 97 of a fourth cleaning module 334a is retracted, and the arm passage opening 94 is opened, the first hand 601 and the second hand 602 are moved along the arrangement direction (first axis direction) of the cleaning modules 311a to 314a by the driving of the first electric actuator 62, and the wafer W held by the pair of arms 612 of the second hand 602 is transported from the third cleaning module 333a to the fourth cleaning module 334a and is transferred to the cleaning machine of the fourth cleaning module 334a. Next, after the pair of arms 612 of the second hand 602 are put out to the outside of the housing 91 of the fourth cleaning module 334a, the arm passage opening 94 is closed by the shutter 97 and the wafer W is cleaned by the cleaning machine of the fourth cleaning module 334a.

After the cleaning process in the fourth cleaning module 334a is completed, the shutter 97 is retracted, and the arm passage opening 94 is opened. The hand of the transport robot 111 (see FIGS. 1 and 2) of the load/unload unit 11 is inserted inside of the housing 91 of the fourth cleaning module 334a through the arm passage opening 94, and the wafer W cleaned by the cleaning machine is taken out to the load/unload unit 11.

Figure 11B:
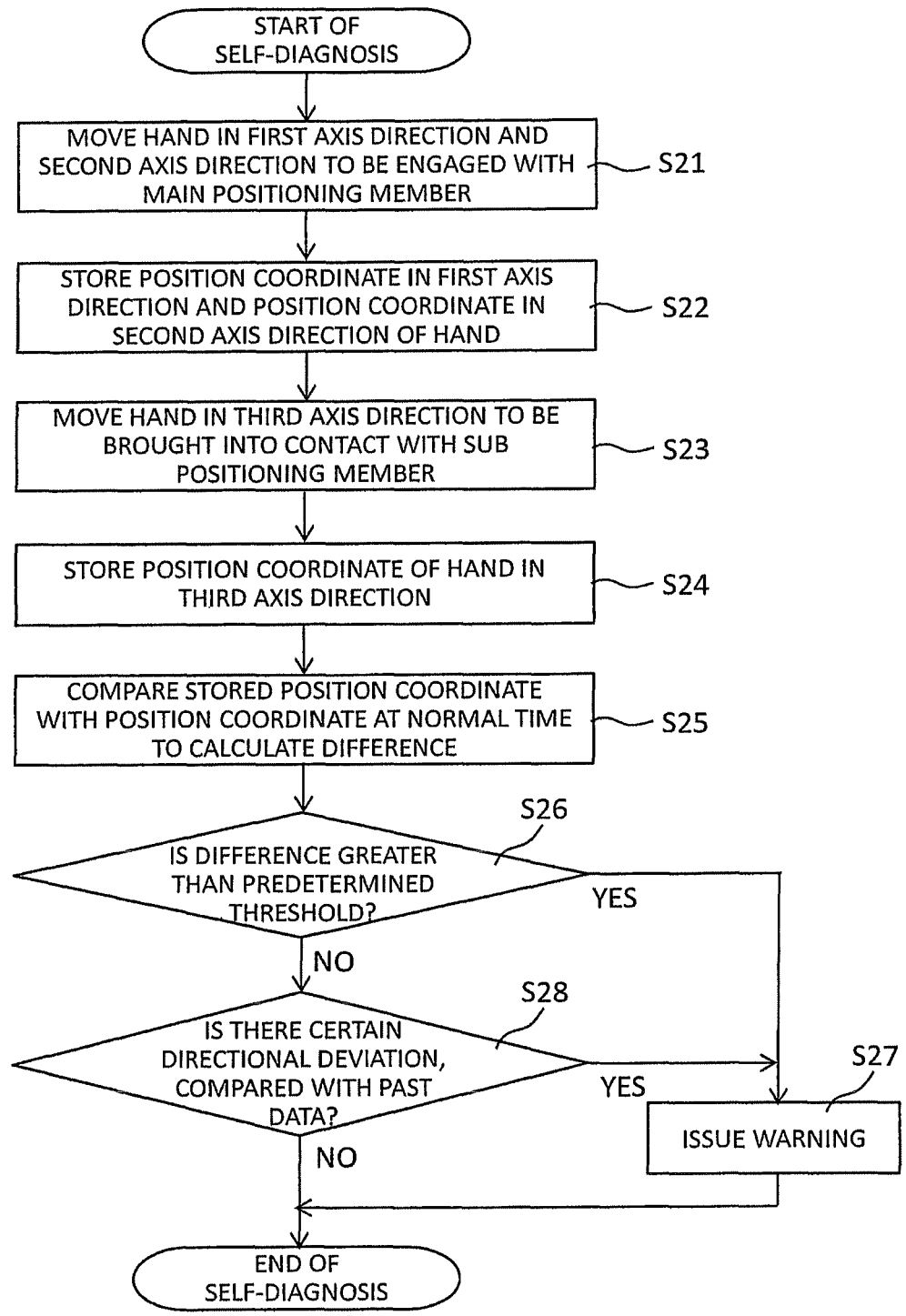
FIG. 11B is a flowchart showing an example of a method of self-diagnosing whether a hand position is normal in the substrate transport system shown in FIG. 4.

Next, referring to FIG. 11B, an example of a method for self-diagnosing whether the position of the hand 601 is normal after the wafer transport by the substrate transport system is performed a predetermined number of times or for a predetermined time will be described.

First, the control unit 15 controls the first electric actuator 62 and the second electric actuator 67 to cause the first electric actuator 62 and the second electric actuator 67 to offset the hand 601 from the substrate transfer position by the first distance in the first axis direction, and move the hand 601 to a position offset by the second distance in the second axis direction to engage the engagement part 601a of the hand 601 with the main positioning member 81 (step S21).

In a state where the engagement part 601a of the hand 601 is engaged with the main positioning member 81, the control unit 15 acquires the position coordinate ($X_2$) in the first axis direction and the position coordinate ($Y_2$) in the second axis direction of the hand 601 from the encoder (not shown) to store them (step S22).

Next, the control unit 15 controls the third electric actuator 641 to cause the third electric actuator 641 to linearly move the hand 601 along the third axis direction (vertical direction), and bring the contact part 601b of the hand 601 into contact with a sub positioning member 82 (Step S23). Here, the control unit 15 may bring the contact part 601b of the hand 601 into contact with the sub positioning member 82 while maintaining the state in which the engagement part 601a of the hand 601 is engaged with the main positioning member 81. The control unit 15 may bring the contact part 601b of the hand 601 into contact with the sub positioning member 82 after eliminating the state in which the engagement part 601a of the hand 601 is engaged with the main positioning member 81. The latter has good operability and is suitable for automation because the number of the directions to check or validate is small when the contact part 601b of the hand 601 is brought into contact with the sub positioning member 82 after eliminating the state in which the engagement part 601a of the hand 601 is engaged with the main positioning member 81.

In a state where the contact part 601b of the hand 601 is brought into contact with the sub positioning member 82, the control unit 15 acquires the position coordinate ($Z_2$) of the hand 601 in the third axis direction from the encoder to store it (not shown) (Step S24).

Next, the control unit 15 compares the stored position coordinates ($X_2$, $Y_2$, $Z_2$) in the first to third axes directions which are stored this time with the position coordinates (for example, ($X_1$, $Y_1$, $Z_1$) stored at the normal time with respect to each axis to calculate the difference between them (step S25).

The control unit 15 determines whether any one of the calculated differences is greater than a predetermined threshold (step S26). When at least any one of the calculated differences is larger than a predetermined threshold (step S26: YES), the control unit 15 determines that an abnormality has occurred in the position control of the hand 601 and issues a warning (step S27). As a result, it is possible to request urgent response such as maintenance from the operator. Furthermore, to avoid danger, the start interlock is applied until the problem is solved.

On the other hand, if all of the calculated differences is equal to or smaller than the predetermined threshold (step S26: NO), the control unit 15 compares the position coordinates ($X_2, Y_2, Z_2$) in the first to third axes directions stored this time with the past data of the position coordinates in the first to third axes directions to determine whether there is a continuous deviation in a certain direction (step S28). A plus/minus measurement error from the center value occurs if the deviation is a simple measurement error, whereas the deviation in a certain direction often occurs in the case of screw loosening or aged deterioration. It is possible to find screw loosening and aged deterioration at an early stage by keeping the data as a record and determining the presence or absence of a trend by comparing the recorded data not only with the latest data but also previous data in step S28.

When it is determined that there is a deviation in a certain direction (step S28: YES), the control unit 15 determines that an abnormality occurs in the position control of the hand 601 and issues a warning (step S27). Furthermore, to avoid danger, the start interlock is applied until the problem is solved.

On the other hand, when it is determined that there is no deviation in a certain direction (step S28: NO), the control unit 15 determines that the position control of the hand 601 is normal, and ends the self-diagnosis processing.

As described above, according to the present embodiment, the main positioning member 81 is permanently mounted on the base 91b, the control unit 15 stores the position coordinate in the first axis direction and position coordinate in the second axis direction of the hand 601 at a position away from the substrate transfer position by a predetermined distance (first design value and second design value) in a state where the hand 601 is positioned by being engaged with the main positioning member 81. Since the positioning is performed by engaging the hand 601 with the main positioning member 81, there is no variations in accuracy, compared with a case where a teaching operation is performed while being visually checked by a human. Further, since the position which is positioned by engaging the hand 601 with the main positioning member 81 is different from the substrate transfer position, it is possible to move the hand 601 to the substrate transfer position without causing the hand 601 to interfere with the main positioning member 81 even if the main positioning member 81 is not detached from the base 91b at the time of actual substrate transfer. Therefore, the working time can be remarkably shortened, compared with a case of the conventional teaching method which requires the operation of detaching the positioning member.

Further, according to the present embodiment, the sub positioning member 82 is also permanently mounted on the base 91b, and the control unit 15 stores the position coordinate of the hand 601 in the third axis direction at a position away from a predetermined distance (third design value) from the substrate transfer position in a state where the hand 601 is positioned by being brought into contact with the sub positioning member 82. This makes it possible to perform the teaching operation in three axes directions in a short time and with no variations in accuracy.

Figure 12A:
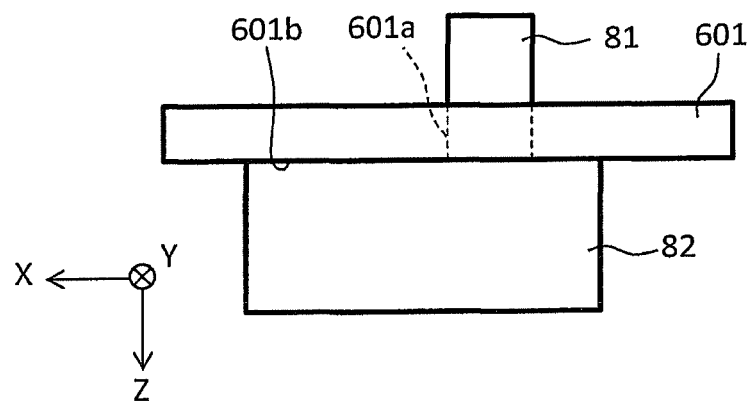
FIG. 12A is a schematic view showing a first modification of the first member and the second member.
Figure 12B:
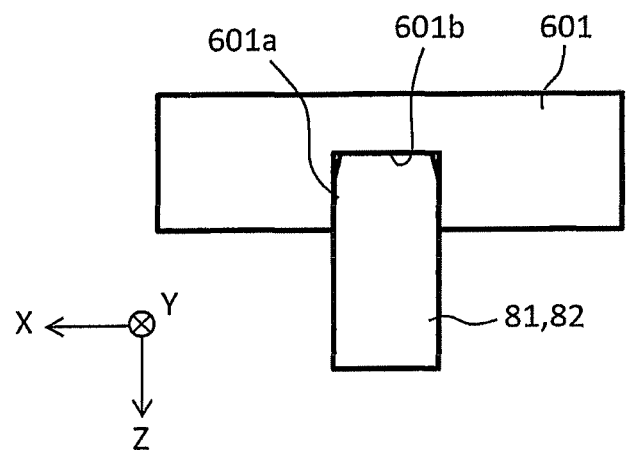
FIG. 12B is a schematic view showing a second modification of a first member and a second member.
Figure 12C:
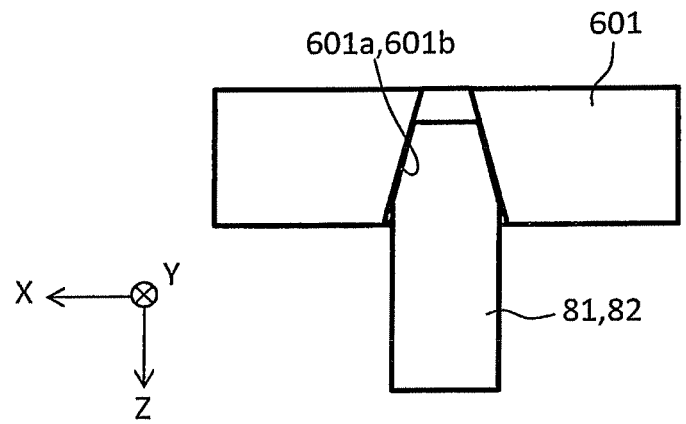
FIG. 12C is a schematic view showing a third modification of the first member and the second member.

In the above-described embodiment, the main positioning member 81 and the sub positioning member 82 are separate members, but the invention is not limited thereto. As shown in FIGS. 12A to 12C, the main positioning member 81 and the sub positioning member 82 may be an integral member. In FIGS. 12A to 12C, the leftward direction on the page is defined as the positive direction of the X axis, the depth direction of the page is defined as the positive direction of the Y axis, and the downward direction of the page is defined as the positive direction of the Z axis.

In the example shown in FIG. 12A, the main positioning member 81 and the sub positioning member 82 are integrated and have a stair-shaped boss (the upper stage is the main positioning member 81 and the lower stage is the sub positioning member 82). A hole of the engagement part 601a of the hand 601 is formed inside of the contact part 601b. When the hand 601 is lowered to the base of the main positioning member 81 in a state where the main positioning member 81 is engaged with the engagement part 601a of the hand 601, the contact part 601b of the hand 601 is brought into contact with the sub positioning member 82.

In the example shown in FIG. 12B, the main positioning member 81 and the sub positioning member 82 are integrated and have a tapered boss. The engagement part 601a and the contact part 601b of the hand 601 are also integral and have a recess shaped hole (bottomed hole). A tapered boss composed of the main positioning member 81 and the sub positioning member 82 is fitted into a recess shaped hole formed by the engagement part 601a and the contact part 601b of the hand 601, whereby the engagement of the engagement part 601a with the main positioning member 81 and the contact between the contact part 601b and the sub positioning member 82 are implemented at the same time in one operation.

In the example shown in FIG. 12C, the main positioning member 81 and the sub positioning member 82 are integrated and have a tapered boss. The engagement part 601a and the contact part 601b of the hand 601 are also integral and have a similar tapered hole. A tapered boss composed of the main positioning member 81 and the sub positioning member 82 is fitted into a tapered hole formed by the engagement part 601a and the contact part 601b of the hand 601, whereby the engagement of the engagement part 601a with the main positioning member 81 and the contact between the contact part 601b and the sub positioning member 82 are implemented at the same time in one operation.

Figure 12D:
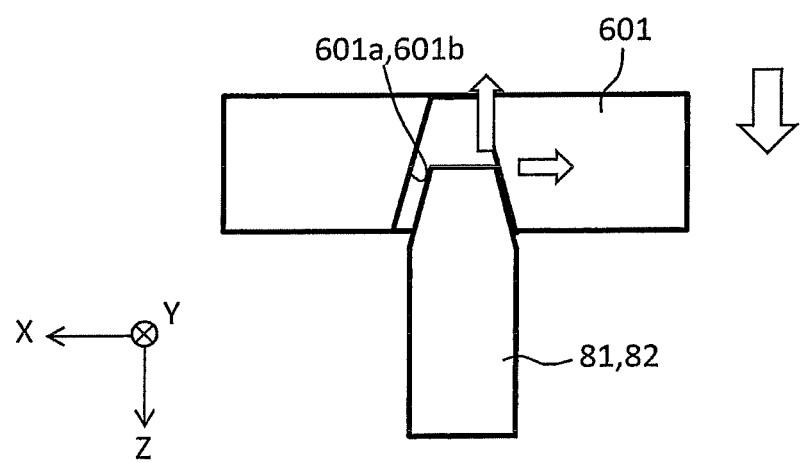
FIG. 12D is a view for explaining an example of the operation of the third modification of the first member and the second member.

In the example shown in FIG. 12C, the hand 601 may be provided with a force sensor (not shown) that detects the direction and the magnitude of the force received by the hand 601. As shown in FIG. 12D, when the center position of the boss and the center position of the hole are deviated in engaging the tapered hole with the tapered boss, the hand 601 receives an external force (reaction force) in a direction (for example, left and right direction) different from the traveling direction (vertical direction in the illustrated example) of the hand 601. Therefore, the force sensor senses this external force (reaction force), and the control unit 15 repeats the position correction accordingly, whereby the position of the hand 601 can be automatically adjusted.

Figure 13:
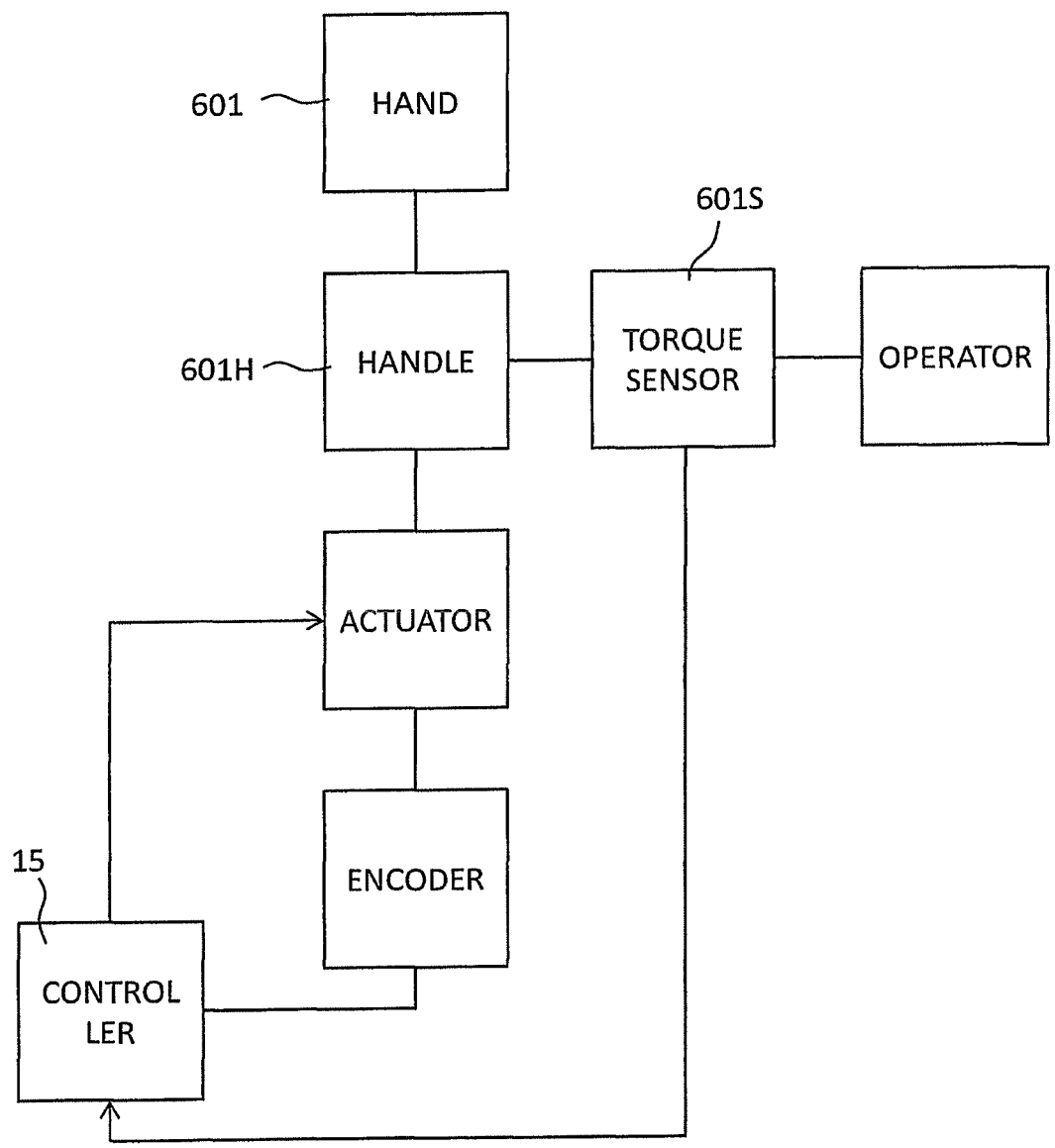
FIG. 13 is a block diagram showing a configuration of a substrate transport system according to a modification.

Next, with reference to FIG. 13, a substrate transport system according to a modification of the above-described embodiment will be described. FIG. 13 is a block diagram showing a configuration of a substrate transport system according to a modification.

In the example shown in FIG. 13, the substrate transport system includes a torque sensor 601S that detects the direction and the magnitude of the force applied to the hand 601 when the hand 601 is manually moved by the operator in the first axis direction, the second axis direction, or the third axis direction. In the illustrated example, the torque sensor 601S is provided on a handle 601H attached to the hand 601.

As shown in FIG. 13, the control unit 15 acquires the detection result from the torque sensor 601S, and controls the first electric actuator 62, the second electric actuator 67, or the third electric actuator 641 so as to assist the force applied to the hand 601 based on the detection result by the torque sensor 601S. Specifically, for example, when the operator holds the handle 601H and applies a force in the right direction (or the left direction), the torque sensor 601S detects the magnitude and the direction of the force. Then, the control unit 15 controls the first electric actuator 62 so that the hand 601 moves in the right direction (or the left direction) based on the detection result by the torque sensor 601S. Further, when the operator holds the handle 601H and applies a force in the upward direction (or downward direction), the torque sensor 601S detects the magnitude and the direction of the force. Then, the control unit 15 controls the third electric actuator 641 so that the hand 601 moves upward (or downward) based on the detection result by the torque sensor 601S. Further, when the operator applies a force in the front direction (or in the depth direction) by holding the handle 601H, the torque sensor 601S detects the magnitude and the direction of the force. Then, the control unit 15 controls the second electric actuator 67 so that the hand 601 moves in the front direction (or depth direction) based on the detection result by the torque sensor 601S.

According to such an aspect, since the control unit 15 controls the first electric actuator 62, the second electric actuator 67, or the third electric actuator 641 so as to assist the force applied to the hand 601, the operator needs only a small force to move the hand 601, and even the operator with a weak power can easily move the hand in the first axis direction, the second axis direction or the third axis direction to perform the teaching operation.

In the above-described first embodiment, the movement mechanism of the three axes of X, Y, and Z is applied to the hand. However, when the movement mechanism of the hand in any one axis, for example, the movement mechanism in the Z direction, can be omitted, the implementation may be performed with the configuration of the movement mechanism with only the two axes of X and Y. Also, even if the base 91b itself includes a movement mechanism in the Z direction having an equivalent function instead of omitting the movement mechanism in the Z direction of the hand, for example, and the teaching is performed, the same effect as the present embodiment can be obtained.

Further, in the above-described embodiment, as an engagement type, the main positioning member 81 has a boss, and the engagement part 601a has a hole engageable with the boss. Instead of this, a cut-out (for example, a horizontal cross section is arcuate, semicircular, or V-shaped) extending in the vertical direction (Z direction) may be formed on the side face of the arm 611, and the main positioning member 81 may include a shape to be engaged with the cut-out.

Second Embodiment

Figure 14:
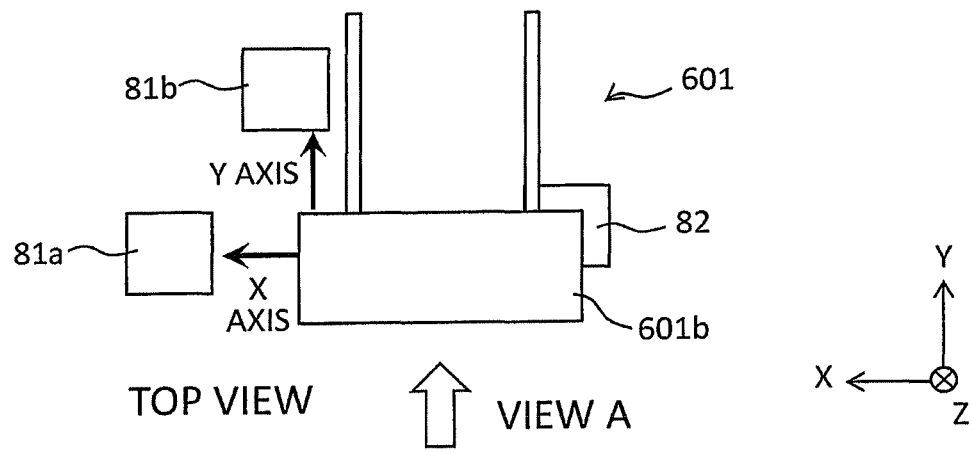
FIG. 14 is a schematic view showing a configuration relating to teaching of a substrate transfer position in a substrate transport system according to a second embodiment.
Figure 15:
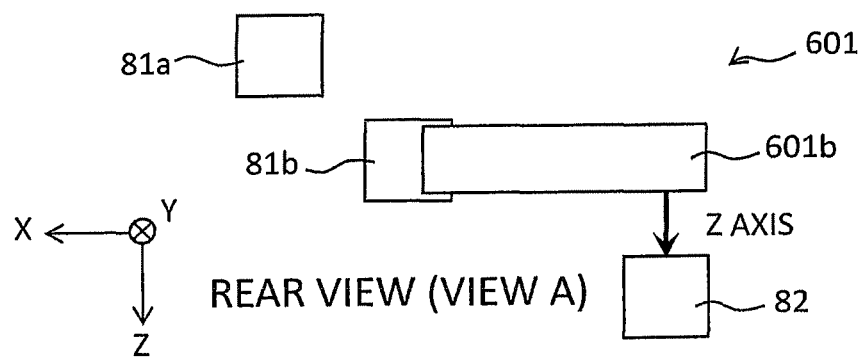
FIG. 15 is a schematic view of the substrate transport system shown in FIG. 14 as viewed from the direction of view A.
Figure 16A:
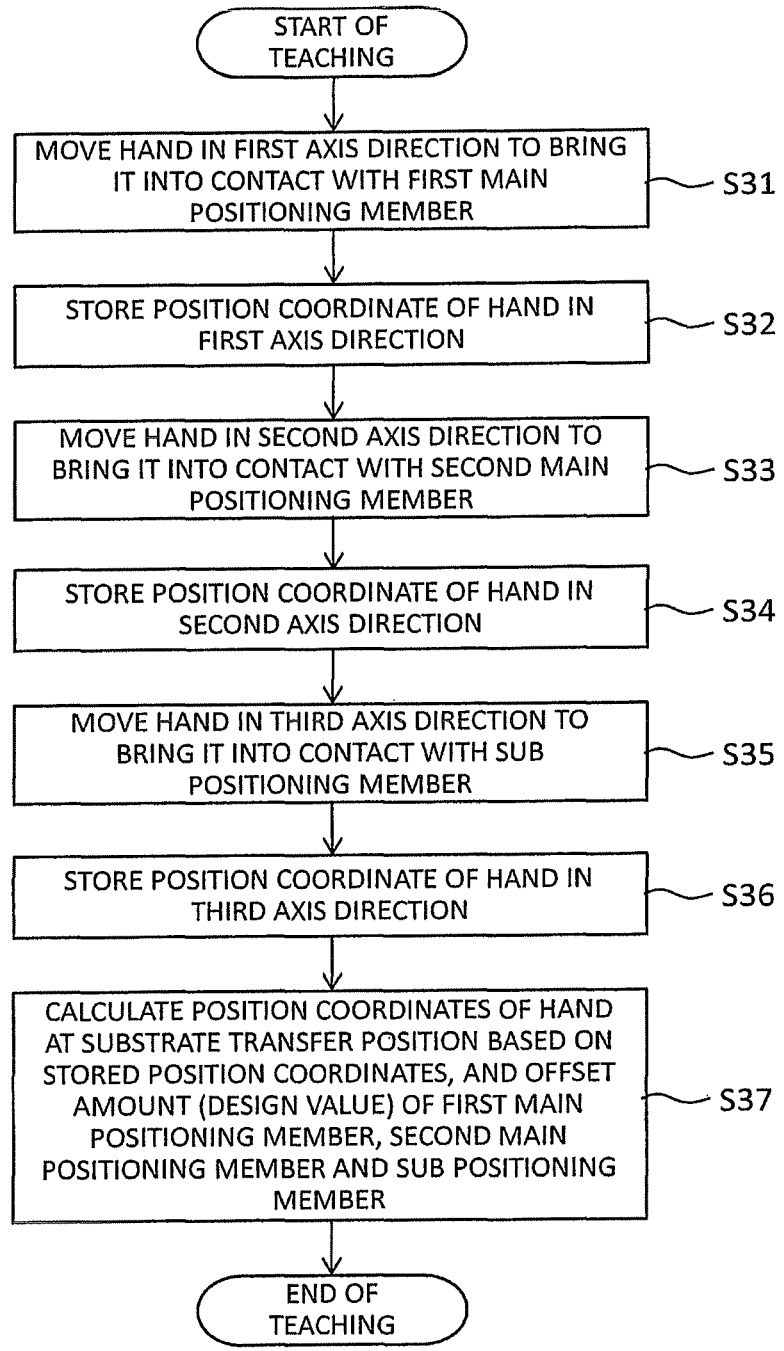
FIG. 16A is a flowchart showing an example of a method of teaching a substrate transfer position in the substrate transport system shown in FIG. 14.
Figure 16B:
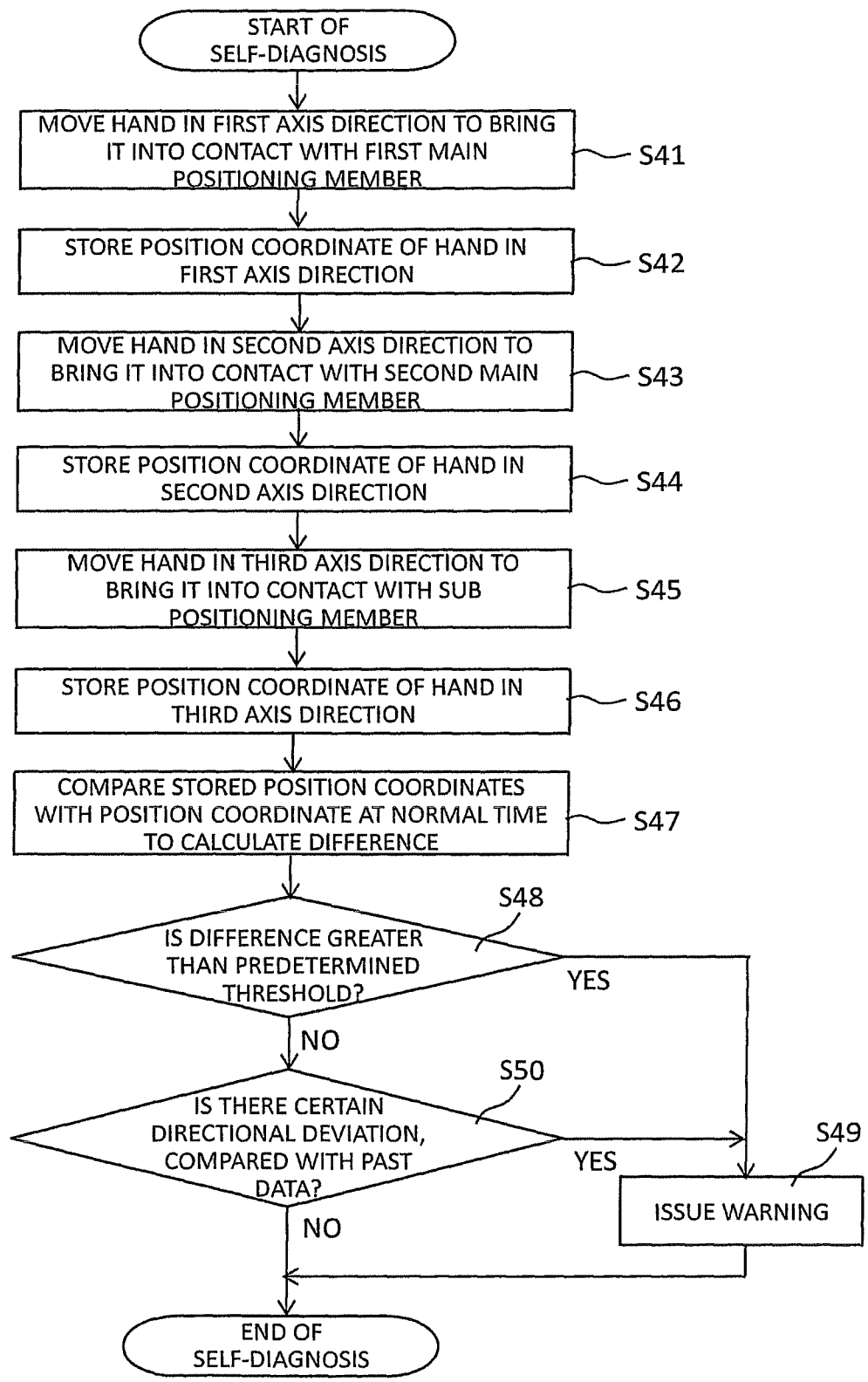
FIG. 16B is a flowchart showing an example of a method of self-diagnosing whether the hand position is normal in the substrate transport system shown in FIG. 14.

The second embodiment will be described with reference to FIGS. 14 to 16B. FIG. 14 is a schematic view showing a configuration relating to teaching of a substrate transfer position in a substrate transport system according to a second embodiment. FIG. 15 is a schematic view of the substrate transport system shown in FIG. 14 viewed from the direction of view A. FIG. 16A is a flowchart showing an example of a method of teaching a substrate transfer position in the substrate transport system shown in FIG. 14. FIG. 16B is a flowchart showing an example of a method of self-diagnosing whether the hand position is normal in the substrate transport system shown in FIG. 14.

As shown in FIGS. 14 and 15, in the second embodiment, instead of the above-described main positioning member 81, a first main positioning member 81a and a second main positioning member 81b are permanently mounted on the base as in the first embodiment, although not shown in FIGS. 14 and 15. The sub positioning member 82 is permanently mounted on the base.

Both the first main positioning member 81a and the second main positioning member 81b are disposed outside of the transport route. Therefore, even if the first main positioning member 81a and the second main positioning member 81b are not detached from the base 91b at the time of substrate transfer, the hand 601 does not interfere with the first main positioning member 81a and the second main positioning member 81b.

When the hand 601 is moved in the first axis direction the first main positioning member 81a can contact the contact part 601b of the hand 601 at a position offset from the substrate transfer position by the first distance (+ΔX) in the first axis direction. In addition, when the hand 601 is moved in the second axis direction, the second main positioning member 81b can contact the contact part 601b of the hand 601 at the position offset from the substrate transfer position by the second distance (+ΔY) in the second axis direction.

In the same manner as in the first embodiment, when the hand 601 is moved in the third axis direction, a sub positioning member 82 can contact the contact part 601b of the hand 601 at a position offset from the substrate transfer position by the third distance (+ΔZ) in the third axis direction.

Next, with reference to FIG. 16A, an example of a method for teaching a substrate transfer position in the substrate transport system having such a configuration will be described.

First, for example, the operator (user) manually moves the hand 601 in the first axis direction, and causes the contact part 601b of the hand 601 to come into contact with the first main positioning member 81a at a position offset from the substrate transfer position by the first distance (+ΔX) in the first axis direction (step S31). Thus, the hand 601 is surely positioned at a predetermined position in the first axis direction.

In a state where the contact part 601b of the hand 601 is brought into contact with the first main positioning member 81a, the control unit 15 acquires the position coordinate $(X_1)$ in the first axis direction of the hand 601 from the encoder (not shown) to store it (Step S32).

Then, for example, the operator (user) manually moves the hand 601 in the second axis direction, and causes the contact part 601b of the hand 601 to come into contact with the second main positioning member 81b at a position offset from the substrate transfer position by the second distance (+ΔY) in the second axis direction (step S33). Thus, the hand 601 is surely positioned at a predetermined position in the second axis direction.

In a state where the contact part 601b of the hand 601 is brought into contact with the second main positioning member 81b, the control unit 15 acquires the position coordinate $(Y_1)$ in the second axis direction of the hand 601 from the encoder (not shown) to store it (Step S34).

Then, for example, the operator (user) manually moves the hand 601 in the third axis direction, and causes the contact part 601b of the hand 601 to come into contact with the sub positioning member 82 at a position offset from the substrate transfer position by the third distance (+ΔZ) in the third axis direction (step S35). As a result, the hand 601 is surely positioned at a predetermined position in the third axis direction.

In a state where the contact part 601*b* of the hand 601 is brought into contact with the sub positioning member 82, the control unit 15 acquires the position coordinate ($Z_1$) of the hand 601 in the third axis direction from the encoder (not shown) to store it (Step S36).

It is to be noted that the order of the positioning and the storage of the position coordinate by the contact in the first axis direction (steps S31 and S32), the positioning and the storage of the position coordinate by the contact in the second axis direction (steps S33 and S34), and the positioning and the storage of the position coordinate by the contact in the third axis direction (steps S35 and S36) is not limited to the order described above, and any order may be possible.

The control unit 15 calculates the position coordinate ($X_1$-$\Delta X$) in the first axis direction of the hand at the substrate transfer position based on the stored position coordinate ($X_1$) in the first axis direction and the first distance (+$\Delta X$) which is the offset amount of the first main positioning member 81*a*. Similarly, the control unit 15 calculates the position coordinate ($Y_1$-$\Delta Y$) of the hand in the second axis direction at the substrate transfer position based on the stored position coordinate ($Y_1$) in the second axis direction and the second distance (+$\Delta Y$) which is the offset amount of the second main positioning member 81*b*. The control unit 15 calculates the position coordinate ($Z_1$-$\Delta Z$) of the hand in the third axis direction at the substrate transfer position based on the stored position coordinate ($Z_1$) in the third axis direction and the third distance (+$\Delta Z$) which is the offset amount of the sub positioning member 82 (step S37).

Thereafter, the control unit 15 controls the first to third electric actuators 62, 67, and 641 to cause the first to third electric actuators 62, 67, and 641 to move the hand 601 to the position coordinates ($X_1$-$\Delta X$, $Y_1$-$\Delta Y$, $Z_1$-$\Delta Z$) of the calculated substrate transfer position. Here, since the movement of the hand 601 is performed by the electric actuators, the hand 601 can be moved to the substrate transfer position automatically (that is, without assistance of the operator) by the current value control. At this time, since the first main positioning member 81*a*, the second main positioning member 81*b*, and the sub positioning member 82 are disposed outside of the transport route, it is possible to move the hand 601 to the substrate transfer position without causing the hand 601 to interfere with the first main positioning member 81*a*, the second main positioning member 81*b*, and the sub positioning member 82 even if the first main positioning member 81*a*, the second main positioning member 81*b* and the sub positioning member 82 are not detached from the base (not shown).

Next, with reference to FIG. 16B, an example of a method for self-diagnosing whether the position of the hand 601 is normal, for example, after the wafer transport by the substrate transport system is performed a predetermined number of times or for a predetermined time will be described.

First, the control unit 15 controls the first electric actuator 62 to cause the first electric actuator 62 to linearly move the hand 601 in the first axis direction, and brings the contact part 601*b* of the hand 601 into contact with the first main positioning member 81*a* (step S41). Here, since the movement of the hand 601 is performed by the electric actuator, it is possible to bring the hand 601 into contact with the positioning member by performing a pressing operation while sufficiently suppressing the impact with extremely small force and low speed by current control to store the position. A force sensor that detects the direction and magnitude of the force applied to the hand 601 may be provided on the hand 601, and the control unit 15 may determines, based on the detection result by the force sensor, that the hand 601 has contacted the positioning member.

In a state where the contact part 601*b* of the hand 601 is brought into contact with the first main positioning member 81*a*, the control unit 15 acquires the position coordinate ($X_2$) in the first axis direction of the hand 601 from the encoder (not shown) to store it (Step S42).

Next, the control unit 15 controls the second electric actuator 67 to cause the second electric actuator 67 to linearly move the hand 601 in the second axis direction, and brings the contact part 601*b* of the hand 601 into contact with the second main positioning member 81*b* (step S43).

In a state where the contact part 601*b* of the hand 601 is brought into contact with the second main positioning member 81*b*, the control unit 15 acquires the position coordinate ($Y_2$) of the hand 601 in the second axis direction from the encoder (not shown) to store it (Step S44).

Next, the control unit 15 controls the third electric actuator 641 to cause the third electric actuator 641 to linearly move the hand 601 in the third axis direction, and brings the contact part 601*b* of the hand 601 into contact with the sub positioning member 82 (step S45).

In a state where the contact part 601*b* of the hand 601 is brought into contact with the sub positioning member 82, the control unit 15 acquires the position coordinate ($Z_2$) of the hand 601 in the third axis direction from the encoder (not shown)r to store it (Step S46).

Next, the control unit 15 compares the position coordinates ($X_2$, $Y_2$, $Z_2$) stored in the first to third axes directions stored this time with the position coordinates (for example, ($X_1$, $Y_1$, $Z_1$)) stored at the normal time for each axis, and calculates the differences between them (step S47).

The control unit 15 determines whether any one of the calculated differences is greater than a predetermined threshold (step S48). When the calculated difference is larger than the predetermined threshold (step S48: YES), the control unit 15 determines that an abnormality occurs in the position control of the hand 601 and issues a warning (step S49). As a result, it is possible to request urgent response such as maintenance from the operator. Furthermore, to avoid danger, the start interlock is applied until the problem is solved.

On the other hand, if the calculated difference is equal to or smaller than the predetermined threshold (step S48: NO), the control unit 15 compares the position coordinates ($X_2$, $Y_2$, $Z_2$) in the first to third axes directions stored this time with the past data of the position coordinates in the first to third axes directions, and determines whether there is a continuous deviation in a certain direction (step S50). A plus/minus measurement error from the center value occurs if the deviation is a simple measurement error, whereas the deviation in a certain direction often occurs in the case of screw loosening or aged deterioration. It is possible to find screw loosening and aged deterioration at an early stage by keeping the data as a record and determining the presence or absence of a trend by comparing the recorded data not only with the latest data but also previous data in step S50.

If it is determined that there is a deviation in a certain direction (step S50: YES), the control unit 15 determines that an abnormality has occurred in the position control of the hand 601 and issues a warning (step S49). Furthermore, to avoid danger, the start interlock is applied until the problem is solved.

On the other hand, when it is determined that there is no deviation in a certain direction (step S50: NO), the control unit 15 determines that the position control of the hand 601 is normal and ends the self-diagnosis processing.

According to the second embodiment as described above, the first main positioning member 81*a* and the second main positioning member 81*b* are permanently mounted on the base (not shown), and the control unit 15 stores the position coordinate of the hand 601 in the first axis direction at a position away from a predetermined distance (first design value) from the substrate transfer position in a state where the hand 601 is brought into contact with the first main positioning member 81*a*. The control unit 15 stores the position coordinate of the hand 601 in the second axis direction at a position away from the substrate transfer position by a predetermined distance in a state where the hand 601 is brought into contact with the second main positioning member 81*b* (second design value). Since the positioning is performed by bringing the hand 601 into contact with the first main positioning member 81*a* and the second main positioning member 81*b*, there is no variations in accuracy, compared with a case where a teaching operation is performed while visually checking by a human. Since both the position which is positioned by bringing the hand 601 into contact with the first main positioning member 81*a* and the position which is positioned by bringing the hand 601 into contact with the second main positioning member 81*b* are different from the substrate transfer position, it is possible to move the hand 601 to the substrate transfer position without causing the hand 601 to interfere with the first main positioning member 81*a* and the second main positioning member 81*b* even if the first main positioning member 81*a* and the second main positioning member 81*b* are not detached from the base (not shown) at the time of actual substrate transfer. Therefore, the working time can be remarkably shortened, compared with a case of the conventional teaching method which requires the operation of detaching the positioning member.

Further, according to the present embodiment, the sub positioning member 82 is also permanently mounted to a base (not shown), and the control unit 15 stores the position coordinate of the hand 601 in the third axis direction at a position away from the substrate transfer position by a predetermined distance (third design value) in the state where the hand 601 is positioned by being brought into contact with the sub positioning member 82. This makes it possible to perform the teaching operation in three axes directions in a short time and with no variations in accuracy.

In the above-described second embodiment, the movement mechanism of the three axes of X, Y, and Z is applied to the hand. However, when the movement mechanism of the hand in any one axis, for example, the movement mechanism in the Z direction, can be omitted, the implementation may be performed with the configuration of the movement mechanism with only the two axes of X and Y. Also, even if the base (not shown) itself includes a movement mechanism in the Z direction having an equivalent function instead of omitting the movement mechanism in the Z direction of the hand, for example, and the teaching is performed, the same effect as the present embodiment can be obtained.

In the above embodiment, a polishing apparatus that polishes a wafer has been described as an example. The present technology is applicable not only to a polishing apparatus but also to other substrate processing apparatuses. For example, a plurality of polishing units may be replaced by another substrate processing unit (for example, a film forming processing unit such as a plating processing unit and a CVD unit, a wet etching unit a dry etching unit, etc.), and a substrate processing apparatus different from the polishing apparatus may be configured. Further, a plurality of different substrate processing units may be combined and disposed in a predetermined direction.

Further, in the above-described embodiment, the aspect in which the hand holds the wafer horizontally has been described as an example, but the present invention is not limited thereto. The present invention is also applicable to an aspect in which the hand holds the wafer vertically.

Although the preferred embodiments of the present technology have been described so far, the present technology is not limited to the above-described embodiments, and it goes without saying that the present technology may be implemented in various forms within the scope of the technical idea thereof.

What is claimed is:

1. A substrate transport system comprising:
   a hand linearly movable along at least a first axis direction and a second axis direction orthogonal to each other;
   a main positioning member permanently mounted on a base, the main positioning member engageable with the hand at a position offset by a first design value in the first axis direction and offset by a second design value in the second axis direction from a substrate transfer position; and
   a control unit that stores a position coordinate in the first axis direction and a position coordinate in the second axis direction of the hand in a state where the hand is positioned by being engaged with the main positioning member.

2. The substrate transport system according to claim 1, wherein the hand is linearly movable along a third axis direction orthogonal to the first axis direction and the second axis direction,
   wherein the substrate transport system further comprises a sub positioning member permanently mounted on the base, the sub positioning member being capable of coming into contact with the hand at a position offset from the substrate transfer position by a third design value in the third axis direction, and
   wherein the control unit stores a position coordinate of the hand in the third axis direction in a state where the hand is positioned by being brought into contact with the sub positioning member.

3. The substrate transport system according to claim 2, wherein the main positioning member and the sub positioning member are integrated.

4. The substrate transport system according to claim 2, wherein the main positioning member and the sub positioning member are separate members.

5. The substrate transport system according to claim 2, further comprising a cover that is provided on the base and that surrounds the substrate transfer position,
   wherein the cover has an opening for loading and unloading a substrate, and
   wherein the sub positioning member is disposed at a position which is brought into contact with the hand before the hand comes into contact with an edge of the opening when the hand is moved in the third axis direction.

6. The substrate transport system according to claim 2, wherein the hand has a force sensor that detects a direction and a magnitude of a force applied to the hand, and
   wherein the control unit determines, based on a detection result by the force sensor, whether the hand is brought into contact with the sub positioning member to store the position coordinate of the hand in the third axis direction when it is determined that the hand is brought into contact with the sub positioning member.

7. The substrate transport system according to claim 1, wherein the hand has a pair of openable and closable arms.

8. The substrate transport system according to claim 1, wherein one of the hand and the main positioning member has a boss and the other has a hole engageable with the boss.

9. The substrate transport system according to claim 8, wherein the boss has a distal end which is tapered.

10. The substrate transport system according to claim 1, wherein the main positioning member is disposed outside of a transport route.

11. The substrate transport system according to claim 10, wherein the sub positioning member also is disposed outside of the transport route.

12. The substrate transport system according to claim 1, wherein the control unit compares the stored position coordinate in the first axis direction and the stored position coordinate in the second axis direction with a position coordinate in the first axis direction and a position coordinate in the second axis direction at a normal time, respectively, and issues a warning in a case where any one of the differences is greater than a predetermined threshold.

13. The substrate transport system according to claim 1, wherein the control unit compares the stored position coordinate in the first axis direction and the stored position coordinate in the second axis direction with a plurality of past data of position coordinate in the first axis direction and a plurality of past data of position coordinates in the second axis direction, respectively, and issues a warning in a case where it is determined that a deviation in a certain direction occurs.

14. The substrate transport system according to claim 1, further comprising:
a first electric actuator that linearly moves the hand along the first axis direction;
a second electric actuator that linearly moves the hand along the second axis direction; and
a torque sensor that detects a direction and a magnitude of a force applied to the hand when the hand is manually moved in the first axis direction or the second axis direction,
wherein the control unit controls the first actuator or the second actuator so as to assist the force applied to the hand based on an detection result by the torque sensor.

15. A substrate processing apparatus comprising the substrate transport system according to claim 1.

16. A substrate transport system comprising:
a hand linearly movable along at least a first axis direction and a second axis direction orthogonal to each other;
a first main positioning member permanently mounted on a base, the first main positioning member being capable of coming into contact with the hand at a position offset from a substrate transfer position by a first design value in the first axis direction;
a second main positioning member permanently mounted on the base, the second main positioning member being capable of coming into contact with the hand at a position offset from the substrate transfer position by a second design value in the second axis direction; and
a control unit that (a) stores a position coordinate of the hand in the first axis direction in a state where the hand is positioned by being brought into contact with the first main positioning member, and (b) stores a position coordinate of the hand in the second axis direction in a state where the hand is positioned by being brought into contact with the second main positioning member.

17. The substrate transport system according to claim 16, wherein the hand is linearly movable along a third axis direction orthogonal to the first axis direction and the second axis direction,
wherein the substrate transport system further comprises a sub positioning member permanently mounted on the base, the sub positioning member being capable of coming into contact with the hand at a position offset from the substrate transfer position by a third design value in the third axis direction, and
wherein the control unit stores a position coordinate of the hand in the third axis direction in a state where the hand is positioned by being brought into contact with the sub positioning member.

18. The substrate transport system according to claim 16, wherein the hand includes a force sensor that detects a direction and a magnitude of a force applied to the hand, and
wherein the control unit determines, based on the detection result by the force sensor, whether the hand is brought into contact with the first main positioning member, and whether the hand is brought into contact with the second main positioning member, and stores the position coordinate of the hand in the first axis direction when it is determined that the hand is brought into contact with the first main positioning member, and stores the position coordinate of the hand in the second axis direction when it is determined that the hand is brought into contact with the second main positioning member.

19. A method for adjusting a position of a hand linearly movable along at least a first axis direction and a second axis direction orthogonal to each other, the method comprising:
positioning by engaging the hand with a main positioning member permanently mounted on a base at a position offset by a first design value in the first axis direction and offset by a second design value in the second axis direction from a substrate transfer position; and
storing a position coordinate in the first axis direction and a position coordinate in the second axis direction of the hand in a state where the hand is positioned by being engaged with the main positioning member.

20. The method for adjusting a position of a hand according to claim 19, wherein the hand is linearly movable along a third axis direction orthogonal to the first axis direction and the second axis direction, and
wherein the method further comprises:
positioning by bringing the hand into contact with a sub positioning member permanently mounted on the base at a position offset from the substrate transfer position by a third design value in the third axis direction; and
storing a position coordinate of the hand in the third axis direction in a state where the hand is brought into contact with the sub positioning member.

21. A method for adjusting a position of a hand linearly movable along at least a first axis direction and a second axis direction orthogonal to each other, the method comprising:
positioning by bringing the hand into contact with a first main positioning member permanently mounted on a base at a position offset from a substrate transfer position by a first design value in the first axis direction;
storing a position coordinate of the hand in the first axis direction in a state where the hand is brought into contact with the first main positioning member;
positioning by bringing the hand into contact with a second main positioning member permanently mounted on the base at a position offset from the substrate transfer position by a second design value in the second axis direction; and storing a position coordinate of the hand in the second axis direction in a state where the hand is brought into contact with the second main positioning member.

22. The method for adjusting a position of a hand according to claim 21, wherein the hand is linearly movable along a third axis direction orthogonal to the first axis direction and the second axis direction, wherein the method further comprising:

positioning by bringing the hand into contact with a sub positioning member permanently mounted on the base at a position offset from the substrate transfer position by a third design value in the third axis direction; and storing a position coordinate of the hand in the third axis direction in a state where the hand is brought into contact with the sub positioning member.

* * * * *